United States Patent
Kim et al.

(10) Patent No.: US 10,490,119 B2
(45) Date of Patent: Nov. 26, 2019

(54) DISPLAY DEVICE

(71) Applicant: Samsung Display Co., Ltd., Yongin-si, Gyeonggi-do (KR)

(72) Inventors: Yang Wan Kim, Yongin-si (KR); Su Jin Lee, Yongin-si (KR); Sun Ja Kwon, Yongin-si (KR); Byung Sun Kim, Yongin-si (KR); Hyun Ae Park, Yongin-si (KR); Hyung Jun Park, Yongin-si (KR); Jae Yong Lee, Yongin-si (KR); Yu Jin Jeon, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/712,657

(22) Filed: Sep. 22, 2017

(65) Prior Publication Data
US 2018/0090061 A1    Mar. 29, 2018

(30) Foreign Application Priority Data
Sep. 23, 2016   (KR) .......................... 10-2016-0122426

(51) Int. Cl.
*G09G 3/30* (2006.01)
*G09G 3/3208* (2016.01)
(Continued)

(52) U.S. Cl.
CPC ......... *G09G 3/3208* (2013.01); *G09G 3/3233* (2013.01); *H01L 27/326* (2013.01);
(Continued)

(58) Field of Classification Search
CPC .............. G09G 3/3208; G09G 3/3233; G09G 2320/0223; G09G 2320/0233;
(Continued)

(56) References Cited

U.S. PATENT DOCUMENTS

| 7,579,624 B2 | 8/2009 | Takasugi et al. |
| 8,665,249 B2 | 3/2014 | Suh |

(Continued)

FOREIGN PATENT DOCUMENTS

| EP | 1063630 A2 | 12/2000 |
| EP | 2085952 A1 | 8/2009 |

(Continued)

OTHER PUBLICATIONS

Extended European Search Report, dated Mar. 21, 2018, 15 pages.
(Continued)

*Primary Examiner* — Adam R. Giesy
(74) *Attorney, Agent, or Firm* — Innovation Counsel LLP

(57) ABSTRACT

A display device includes: a substrate including a first pixel region, at least one second pixel region having a smaller area than the first pixel region, the at least one second pixel region being disposed adjacent to the first pixel region, and a peripheral region surrounding the first pixel region and the second pixel region; first and second pixels respectively provided in the first and second pixel regions; first and second lines respectively connected to the first and second pixels; a dummy line connected to one of the first and second lines to extend to the peripheral region; and a first dummy part including a dummy pixel connected to the dummy line in the peripheral region.

30 Claims, 13 Drawing Sheets

(51) Int. Cl.
  *H01L 27/32* (2006.01)
  *H01L 29/40* (2006.01)
  *H01L 51/52* (2006.01)
  *G09G 3/3233* (2016.01)

(52) U.S. Cl.
  CPC ...... *H01L 27/3223* (2013.01); *H01L 27/3276* (2013.01); *H01L 27/3288* (2013.01); *H01L 29/40* (2013.01); *H01L 51/5203* (2013.01); *G09G 2300/0413* (2013.01); *G09G 2300/0426* (2013.01); *G09G 2300/06* (2013.01); *G09G 2300/0814* (2013.01); *G09G 2320/0223* (2013.01); *G09G 2320/0233* (2013.01)

(58) Field of Classification Search
  CPC ... G09G 2300/0413; G09G 2300/0814; G09G 2300/06; G09G 2300/0426; H01L 27/3276; H01L 27/326; H01L 27/3223; H01L 27/3288; H01L 29/40; H01L 51/5203
  See application file for complete search history.

(56) References Cited

U.S. PATENT DOCUMENTS

| | | |
|---|---|---|
| 2004/0125258 A1 | 7/2004 | Moon et al. |
| 2006/0244387 A1 | 11/2006 | Park et al. |
| 2007/0080433 A1 | 4/2007 | Lai |
| 2008/0218450 A1 | 9/2008 | Park |
| 2009/0102758 A1 | 4/2009 | Anzai et al. |
| 2009/0102824 A1 | 4/2009 | Tanaka et al. |
| 2009/0303404 A1 | 12/2009 | Kretz |
| 2010/0020059 A1 | 1/2010 | Suh |
| 2010/0073335 A1 | 3/2010 | Min et al. |
| 2010/0177024 A1 | 7/2010 | Choi |
| 2011/0084955 A1 | 4/2011 | Kim |
| 2013/0106817 A1 | 5/2013 | Gang et al. |
| 2015/0022513 A1* | 1/2015 | Kim ................ G09G 3/3225 345/212 |
| 2015/0325593 A1 | 11/2015 | Shih et al. |
| 2016/0019856 A1 | 7/2016 | Tanaka et al. |

FOREIGN PATENT DOCUMENTS

| | | |
|---|---|---|
| KR | 10-0672792 B1 | 1/2007 |
| KR | 10-2008-0060886 A | 7/2008 |
| KR | 10-1064425 B1 | 9/2011 |
| KR | 10-1101070 B1 | 12/2011 |
| KR | 10-1376654 B1 | 3/2014 |
| KR | 10-1416529 B1 | 7/2014 |
| KR | 10-1432126 B1 | 8/2014 |
| WO | 2007069187 A2 | 6/2007 |

OTHER PUBLICATIONS

Partial European Search Report for Application No. 17192551.4, dated Dec. 14, 2017.

EPO Office Action Report, Application No. 17166354.5, dated Mar. 6, 2019, 10 pages.

* cited by examiner

DISPLAY DEVICE

RELATED APPLICATIONS

The present application claims priority to Korean Patent Application No. 10-2016-0122426, filed on Sep. 23, 2016, in the Korean Intellectual Property Office, the entire disclosure of which is incorporated by reference herein.

BACKGROUND

1. Field

An aspect of the present disclosure relates to a display device.

2. Description of the Related Art

A display device includes a plurality of pixels each including a display element, and each pixel includes lines and a plurality of transistors connected to the lines, the plurality of transistors driving the display element. The lines may have different load values according to their lengths. In a final image provided from the display device, a difference in luminance may be caused by a difference in load value.

SUMMARY

Embodiments provide a display device having uniform luminance regardless of regions.

According to an aspect of the present disclosure, there is provided a display device including: a substrate including a first pixel region, at least one second pixel region having a smaller area than the first pixel region, the at least one second pixel region being disposed adjacent to the first pixel region, and a peripheral region surrounding the first pixel region and the second pixel region; first and second pixels respectively provided in the first and second pixel regions; first and second lines respectively connected to the first and second pixels; a dummy line connected to one of the first and second lines to extend to the peripheral region; and a first dummy part including a dummy pixel connected to the dummy line in the peripheral region.

A length of the first line may be greater than that of the second line, and the dummy line is connected to the second line.

The display device may further include data lines providing a data signal to the first and second pixels. The first line may be one of a first scan line providing a scan signal to the first pixel and a first light emitting control line providing a light emitting control signal to the first pixel. The second line may be one of a second scan line providing a scan signal to the second pixel and a second light emitting control line providing a light emitting control signal to the second pixel.

Each of the first and second pixels may include a transistor connected to a corresponding one of the data lines and a corresponding one of the first and second scan lines, a protective layer covering the transistor, and an organic light emitting device connected to the transistor on the protective layer. The transistor may include: an active pattern provided on the substrate; a source electrode and a drain electrode, each connected to the active pattern; a gate electrode provided on the active pattern with a gate insulating layer interposed therebetween; and an interlayer insulating layer including a first interlayer insulating layer, a second interlayer insulating layer, and a third interlayer insulating layer, which cover the gate electrode and are sequentially stacked. The organic light emitting device may include: a first electrode connected to the transistor; a pixel defining layer exposing the first electrode; a light emitting layer provided on the first electrode; and a second electrode provided on the light emitting layer.

The dummy pixel may include: a dummy data line intersecting the dummy line; a dummy transistor connected to the dummy line and the dummy data line; the protective layer covering the dummy transistor; the pixel defining layer provided on the protective layer; an organic layer provided on the pixel defining layer; and a second dummy electrode provided on the organic layer. The second dummy electrode may include the same material as the second electrode.

The dummy transistor may include: a dummy active pattern provided on the substrate; a dummy source electrode and a dummy drain electrode, each connected to the dummy active pattern; and a dummy gate electrode provided on the dummy active pattern with the gate insulating layer interposed therebetween, the dummy gate electrode being connected to the dummy line.

The first dummy part may include a parasitic capacitor formed by the dummy active pattern and the dummy line and a parasitic capacitor formed by the dummy data line and the dummy line.

The dummy pixel may include a first dummy pixel and a second dummy pixel, which are electrically connected to each other, and the first dummy pixel may be closer to the second pixel region than the second dummy pixel.

The second dummy pixel may further comprise a first dummy electrode including the same material as the first electrode and provided between the protective layer and the pixel defining layer.

The first dummy electrode and the second dummy electrode may be electrically connected to each other, to be applied with the same power.

The display device may further include a second dummy part overlapping with the dummy line in the peripheral region, the second dummy part being electrically connected to the first dummy part and disposed to be spaced apart from the first dummy part.

The display device may further include a power supply line disposed on the interlayer insulating layer in the peripheral region, the power supply line overlapping with the dummy line. The second dummy part may include a parasitic capacitor formed by the dummy line and the power supply line.

The dummy line may be disposed in the same layer as the gate electrode.

The first line may be a first scan line providing a scan signal to the first pixel. The second line may be a second scan line providing a scan signal to the second pixel.

The first line may be a first light emitting line providing a light emitting control signal to the first pixel. The second line may be a second light emitting line providing a light emitting control signal to the second pixel.

According to an aspect of the present disclosure, there is provided a display device including: a substrate including a first pixel region, a second pixel region and a third region spaced apart from each other, the second pixel region and the third pixel region having a smaller area than the first pixel region, the second pixel region and the third pixel region being disposed adjacent to the first pixel region, and a peripheral region surrounding the first to third pixel regions; first to third pixels respectively provided in the first to third pixel regions; first to third lines connected to the first to third pixels; first and second dummy lines connected to the second and third lines, the first and second dummy lines extending to the peripheral region; a first dummy part provided in the peripheral region, the first dummy part compensating for a difference in load value between the first line and the second line; and a second dummy part provided in the peripheral region, the second dummy part compensating for a difference in load value between the first line and the third line, wherein each of the first and second dummy parts includes a first sub-dummy part including a dummy pixel connected to the first and second dummy lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
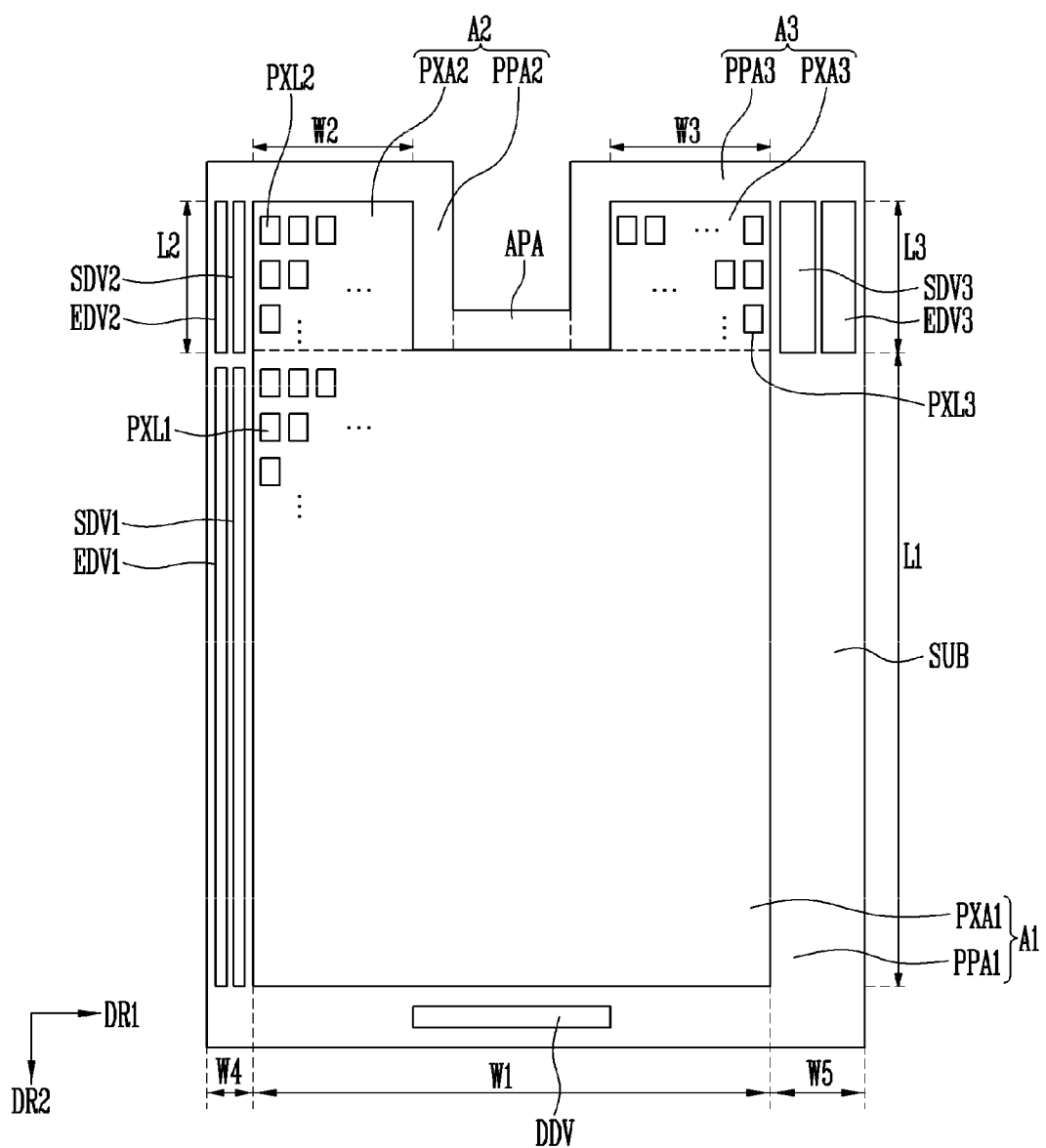
FIG. 1 is a plan view illustrating a display device according to an embodiment of the present disclosure.

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

Like numbers refer to like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

FIG. 1 is a plan view illustrating a display device according to an embodiment of the present disclosure.

Referring to FIG. 1, the display device according to the embodiment of the present disclosure may include a substrate SUB, pixels PXL1, PXL2, and PXL3 (hereinafter, referred to as PXL), a driver that is provided on the substrate SUB and drives the pixels PXL, a power supply that supplies power to the pixels PXL, and a line that connects the pixels PXL to the driver.

The substrate SUB includes a plurality of regions, and at least two among the regions may have different areas. As an example, the substrate SUB may have two regions, and the two regions may have areas different from each other. As another example, the substrate SUB may have three regions. In this case, all of the three regions may have areas different from one another, or two regions among the three regions may have same areas and the other one region may have an area different from the two regions. As still another example, the substrate SUB may have four or more regions.

In the following embodiment, for convenience of description, a case where the substrate SUB includes three regions, i.e., first to third regions A1, A2, and A3 is illustrated as an example.

The first to third regions A1, A2, and A3 may be simultaneously driven, or may be driven independently from one another. The first to third regions A1, A2, and A3 may have various shapes. For example, the first to third regions A1, A2, and A3 may be provided in various shapes such as a closed-shape polygon including linear sides, a circle, an ellipse, etc., including curved sides, and a semicircle, a semi-ellipse, etc., including linear and curved sides.

The first to third regions A1, A2, and A3 may include pixel regions PXA1, PXA2, and PXA3 (hereinafter, referred to as PXA) and peripheral regions PPA1, PPA2, and PPA3 (hereinafter, referred to as PPA), respectively. The pixel regions PXA are regions in which pixels PXL for displaying images are provided. Each pixel PXL will be described later.

In an embodiment of the present disclosure, the first to third pixel regions PXA1, PXA2, and PXA3 may roughly have shapes corresponding to those of the first to third regions A1, A2, and A3, respectively.

The peripheral regions PPA are regions in which the pixels PXL are not provided, and any image is not displayed in the peripheral regions PPA. The driver for driving the pixels PXL, the power supply for supplying power to the pixels PXL, and a portion of lines (not shown) for connecting the pixels PXL to the driver may be provided in the peripheral regions PPA. The peripheral regions PPA correspond to a bezel in the final display device, and a width of the bezel may be determined based on widths of the peripheral regions.

A first peripheral region PPA1 may be provided at at least one side of a first pixel region PXA1. In an embodiment of the present disclosure, the first peripheral region PPA1 surrounds the circumference of the first pixel region PXA1, but may be provided at a portion except portions at which the second region A2 and the third region A3, which will be described later, are disposed. In an embodiment of the present disclosure, the first peripheral region PPA1 may include a lateral part extending in a first direction DR1 and a longitudinal part extending in a second direction DR2. The longitudinal part of the first peripheral region PPA1 may be provided in a pair spaced apart from each other along the first direction DR1 with the first pixel region PXA1 interposed therebetween.

The second region A2 may have a smaller area than the first region A1. The second region A2 may include a second pixel region PXA2 in which an image is displayed and a second peripheral region PPA2 surrounding at least a portion of the second pixel region PXA2.

The second pixel region PXA2 may be provided in a shape corresponding to that of the second region A2. In an embodiment of the present disclosure, the second pixel region PXA2 may have a second width W2 smaller than a first width W1 of the first region A1. The second pixel region PXA2 may have a second length L2 smaller than a first length L1 of the first region A1. The second pixel region PXA2 is provided in a shape protruding from the first pixel region PXA1, and may be directly connected to the first pixel region PXA1. In other words, one side of the second pixel region PXA2 may contact one side of the first pixel region PXA1.

The second peripheral region PPA2 may be provided at at least one side of the second pixel region PXA2. In an embodiment of the present disclosure, the second peripheral region PPA2 surrounds the second pixel region PXA2, but may not be provided at a portion at which the first pixel region PXA1 and the second pixel region PXA2 are connected to each other. In an embodiment of the present disclosure, the second peripheral region PPA2 may also include a lateral part extending in the first direction DR1 and a longitudinal part extending in the second direction DR2. The longitudinal part of the second peripheral region PPA2 may be provided in a pair spaced apart from each other along the first direction DR1 with the second pixel region PXA2 interposed therebetween.

The third region A3 may have a smaller area than the first region A1. For example, the third region A3 may have the same area as the second region A2. The third region A3 may include a third pixel region PXA3 in which an image is displayed and a third peripheral region PPA3 surrounding at least a portion of the third pixel region PXA3.

The third pixel region PXA3 may be provided in a shape corresponding to that of the third region A3. In an embodiment of the present disclosure, the third pixel region PXA3 may have a third width W3 smaller than the first width W1 of the first region A1. The third pixel region PXA3 may have a third length L3 smaller than the first length L1 of the first region A1. The second width W2 and the third width W3 may be equal to each other. In addition, the second length L2 and the third length L3 may be equal to each other.

The third pixel region PXA3 is provided in a shape protruding from the first pixel region PXA1, and may be directly connected to the first pixel region PXA1. In other words, one side of the third pixel region PXA3 may contact one side of the first pixel region PXA1.

The third peripheral region PPA3 may be provided at at least one side of the third pixel region PXA3. In an embodiment of the present disclosure, the third peripheral region PPA3 surrounds the third pixel region PXA3, but may not be provided at a portion at which the first pixel region PXA1 and the third pixel region PXA3 are connected to each other. In an embodiment of the present disclosure, the third peripheral region PPA3 may also include a lateral part extending in the first direction DR1 and a longitudinal part extending in the second direction DR2. The longitudinal part of the third peripheral region PPA3 may be provided in a pair spaced apart from each other along the first direction with the first pixel region PXA1 interposed therebetween.

In an embodiment of the present disclosure, the third region A3 may have a shape line symmetric to the second region A2 with respect to a center line of the first region A1. In this case, the arrangement of components provided in the third region A3 may be substantially identical to that in the second region A2 except some lines.

Therefore, the substrate SUB may have a shape in which the second region A2 and the third region A3 protrude in the second direction DR2 from the first region A1. In addition, since the second region A2 and the third region A3 are disposed to be spaced apart from each other, the substrate SUB may have a shape in which it is depressed between the second region A2 and the third region A3. That is, the substrate SUB may have a notch between the second region A2 and the third region A3.

In an embodiment of the present disclosure, the longitudinal parts of the first peripheral region PPA1 may be respectively connected to some of the longitudinal parts of the second peripheral region PPA2 and the third peripheral region PPA3. For example, a left longitudinal part of the first peripheral region PPA1 may be connected to a left longitudinal part of the second peripheral region PPA2. A right longitudinal part of the first peripheral region PPA1 may be connected to a right longitudinal part of the third peripheral region PPA3. In addition, the left longitudinal part of the first peripheral region PPA1 and the left longitudinal part of the second peripheral region PPA2 may have the same width W4. The right longitudinal part of the first peripheral region PPA1 and the right longitudinal part of the third peripheral region PPA3 may have the same width W5.

The width W4 of the left longitudinal parts of the first peripheral region PPA1 and the second peripheral region PPA2 may be different from the width W5 of the right longitudinal parts of the first peripheral region PPA1 and the third peripheral region PPA3. For example, the width W4 of the left longitudinal parts of the first peripheral region PPA1 and the second peripheral region PPA2 may be smaller than the width W5 of the right longitudinal parts of the first peripheral region PPA1 and the third peripheral region PPA3.

In an embodiment of the present disclosure, the substrate SUB may further include an additional peripheral region APA. The additional peripheral region APA may be provided adjacent to the first pixel region PXA1, the second peripheral region PPA2, and the third peripheral region PPA3. For example, the additional peripheral region APA may connect the second peripheral region PPA2 to the third peripheral region PPA3. For example, the additional peripheral region APA may connect a right longitudinal part of the second peripheral region PPA2 to a left longitudinal part of the third peripheral region PPA3. That is, the additional peripheral region APA may be provided at a side of the first pixel region PXA1 between the second region A2 and the third region A3.

The pixels PXL may be provided in the pixel regions PXA, i.e., the first to third pixel regions PXA1, PXA2, and PXA3, on the substrate SUB. Each pixel PXL is a minimum unit for displaying an image, and a plurality of pixels PXL may be provided in the first to third pixel regions PXA1, PXA2, and PXA3. The pixels PXL may include a display element that emits light. For example, the display element may be any one of a liquid crystal display (LCD) element, an electrophoretic display (EPD) element, an electrowetting display (EWD) element, and an organic light emitting display (OLED) element. Meanwhile, for convenience of description, a case where the display element is an OLED element will be illustrated below as an example.

The pixel PXL may emit light of one of red, green, and blue, but the present disclosure is not limited thereto. For example, the pixel PXL may emit light of a color such as cyan, magenta, yellow, or white.

The pixels PXL may include first pixels PXL1 arranged in the first pixel region PXA1, second pixels PXL2 arranged in the second pixel region PXA2, and third pixels PXL3 arranged in the third pixel region PXA3. In an embodiment of the present disclosure, each of the first to third pixels PXL1, PXL2, and PXL3 may be provided in plurality to be arranged in a matrix form along rows extending in the first direction DR1 and columns extending in the second direction DR2. However, the arrangement of the first to third pixels PXL1, PXL2, and PXL3 is not particularly limited, and the first to third pixels PXL1, PXL2, and PXL3 may be arranged in various forms. For example, the first pixels PXL1 may be arranged such that the first direction DR1 becomes the row direction, but the second pixels PXL2 may be arranged along a direction different from the first direction DR1, e.g., a direction oblique to the first direction DR1 may become the row direction. In addition, it will be apparent that the third pixels PXL3 may be arranged in a direction identical to or different from that of the first pixels PXL1 and/or the second pixels PXL2. Alternatively, in another embodiment of the present disclosure, the row direction may become the second direction DR2, and the column may become the first direction DR1.

Meanwhile, in the second region A2 and the third region A3, the number of second pixels PXL2 and third pixels PXL3 may be changed depending on rows. More specifically, the second region A2 and the third region A3 may include a first sub-region and a second sub-region, and in the second region A2 and the third region A3, the length of a row disposed in the second sub-region may be greater than that of a row disposed in the first sub-region. The number of second pixels PXL2 and third pixels PXL3, which are arranged on the row, may be decreased as the length of the row is shortened. Therefore, in the second region A2 and the third region A3, the number of second pixels PXL2 and third pixels PXL3, which are arranged on a row disposed in the second sub-region, may be smaller than that of second pixels PXL2 and third pixels PXL3, which are arranged on a row disposed in the first sub-region. In addition, as the length of the row is shortened, the lengths of lines for connecting the second pixels PXL2 and the third pixels PXL3 may be shortened.

The driver provides a signal to each pixel PXL through the line, and accordingly, can control driving of each pixel PXL. In FIG. 1, the line is omitted for convenience of description. The line will be described later.

The driver may include scan drivers SDV1, SDV2, and SDV3 (hereinafter, referred to as SDV) that provide a scan signal to each pixel PXL through a scan line, light emitting drivers EDV1, EDV2, and EDV3 (hereinafter, referred to as EDV) that provide a light emitting control signal to each pixel PXL along a light emitting control line, a data driver DDV that provides a data signal to each PXL to a data line, and a timing controller (not shown). The timing controller may control the scan drivers SDV, the light emitting drivers EDV, and the data driver DDV.

In an embodiment of the present disclosure, the scan drivers SDV may include a first scan driver SDV1 connected to the first pixels PXL1, a second scan driver SDV2 connected to the second pixels PXL2, and a third scan driver SDV3 connected to the third pixels PXL3. In an embodiment of the present disclosure, the light emitting drivers EDV may include a first light emitting driver EDV1 connected to the first pixels PXL1, a second light emitting driver EDV2 connected to the second pixels PXL2, and a third light emitting driver EDV3 connected to the third pixels PXL3.

The first scan driver SDV1 may be disposed at the longitudinal part in the first peripheral region PPA1. Since the peripheral part of the first peripheral region PPA1 is provided in pair spaced apart from each other along the first direction, the first scan driver SDV1 may be disposed at at least one side of the longitudinal part of the first peripheral region PPA1. The first scan driver SDV1 may extend long along the length direction of the first peripheral region PPA1.

In a similar manner, the second scan driver SDV2 may be disposed in the second peripheral region PPA2, and the third scan driver SDV3 may be disposed in the third peripheral region PPA3.

In an embodiment of the present disclosure, the scan drivers SDV may be directly mounted on the substrate SUB. When the scan drivers SDV are directly mounted on the substrate SUB, the scan drivers SDV may be formed together with the pixels PXL in a process of forming the pixels PXL. However, the mounting position and forming method of the scan drivers SDV are not limited thereto. For example, the scan drivers SDV may be an integrated circuit (IC) chip and the IC chip may be provided in a chip on glass form on the substrate SUB. Alternatively, the scan drivers SDV may be mounted on a printed circuit board to be connected to the substrate SUB through a connection member.

Similar to the first scan driver SDV1, the first light emitting driver EDV1 may also be disposed at the longitudinal part in the first peripheral region PPA1. The first light emitting driver EDV1 may be disposed at at least one side of the longitudinal part of the first peripheral region PPA1. The first light emitting driver EDV1 may extend along the length direction of the first peripheral region PPA1.

In a similar manner, the second light emitting driver EDV2 may be disposed in the second peripheral region PPA2, and the third light emitting driver EDV3 may be disposed in the third peripheral region PPA3.

In an embodiment of the present disclosure, the light emitting drivers EDV may be directly mounted on the substrate SUB. When the light emitting drivers EDV are directly mounted on the substrate SUB, the light emitting drivers EDV may be formed together with the pixels PXL in the process of forming the pixels PXL. However, the mounting position and forming method of the light emitting drivers EDV are not limited thereto. For example, the light emitting drivers EDV may be an IC chip and the IC chip may be provided in a chip on glass form on the substrate SUB. Alternatively, the light emitting drivers EDV may be mounted on a printed circuit board to be connected to the substrate SUB through a connection member.

In the embodiment of the present disclosure, a case where the scan drivers SDV and the light emitting drivers EDV are adjacent to each other and formed at only one side of the pair of longitudinal parts of the peripheral regions PPA has been illustrated as an example, but the present disclosure is not limited thereto. The arrangement of the scan drivers SDV and the light emitting drivers EDV may be changed in various manners. For example, the first scan driver SDV1 may be provided at one side of the longitudinal part of the first peripheral region PPA1, and the first light emitting driver EDV1 may be provided at the other side of the longitudinal part of the first peripheral region PPA1. Alternatively, the first scan driver SDV1 may be provided at both the sides of the longitudinal part of the first peripheral region PPA1, and the first light emitting driver EDV1 may be provided at only one side of the longitudinal part of the first peripheral region PPA1.

The data driver DDV may be disposed in the first peripheral region PPA1. Particularly, the data driver DDV may be disposed at the lateral part of the first peripheral region PPA1. The data driver DDV may extend along the width direction of the first peripheral region PPA1.

In an embodiment of the present disclosure, the positions of the scan drivers SDV, the light emitting drivers EDV, and/or the data driver DDV may be changed, if necessary.

The timing controller (not shown) may be connected, in various manners, to the first to third scan drivers SDV1, SDV2, and SDV3, the first to third light emitting drivers EDV1, EDV2, and EDV3, and the data driver DDV through lines. The position at which the timing controller is disposed is not particularly limited. For example, the timing controller may be mounted on a printed circuit board to be connected to the first to third scan drivers SDV1, SDV2, and SDV3, the first to third light emitting drivers EDV1, EDV2, and EDV3, and the data driver DDV through a flexible printed circuit board. The printed circuit board may be disposed at various positions such as one side of the substrate SUB and a back side of the substrate SUB.

Scan lines (not shown) of second pixels PXL2 and third pixels PXL3, which correspond to the same row, are electrically connected, and one of the second and third scan drivers SDV2 and SDV3 may be omitted. In addition, light emitting control lines (not shown) of second pixels PXL2 and third pixels PXL3, which correspond to the same row, are electrically connected, and one of the second and third light emitting drivers EDV2 and EDV3 may be omitted.

The power supply may include at least one power supply line ELVDD and ELVSS. For example, the power supply may include a first power supply line ELVDD and a second power supply line ELVSS. The first power supply line ELVDD and the second power supply line ELVSS may supply power to the first pixel PXL1, the second pixel PXL2, and the third pixel PXL3.

One of the first power supply line ELVDD and the second power supply line ELVSS, e.g., the first power supply line ELVDD may be disposed to at least correspond to one side of the first peripheral region PPA1, one side of the second peripheral region PPA2, and one side of the third peripheral region PPA3. For example, the first power supply line ELVDD may be disposed in a region in which the data driver DDV is disposed. In addition, the first power supply line ELVDD may extend in the first direction of the first pixel region PXA1.

The other of the first power supply line ELVDD and the second power supply line ELVSS, e.g., the second power supply line ELVSS may be disposed to surround the first pixel region PXA1, the second pixel region PXA2, and the third pixel region PXA3 except the region in which the data driver DDV of the first peripheral region PPA1 is disposed. For example, the second power supply line ELVSS may have a shape extending along the left longitudinal part of the first peripheral region PPA1, the second peripheral region PPA2, the third peripheral region PPA3, the additional peripheral region APA, and the right longitudinal part of the second peripheral region PPA2.

In the above, a case where the first power supply line ELVDD is disposed to correspond to one side of the first pixel region PXA1 in the first peripheral region PPA1 and the second power supply line ELVSS is disposed in the other peripheral regions has been described as an example, but the present disclosure is not limited thereto. For example, the first power supply line ELVDD and the second power supply line ELVSS may be disposed to surround the first pixel region PXA1, the second pixel region PXA2, and the third pixel region PXA3. A voltage applied to the first power supply line ELVDD may be higher than that applied to the second power supply line ELVSS.

Figure 2:
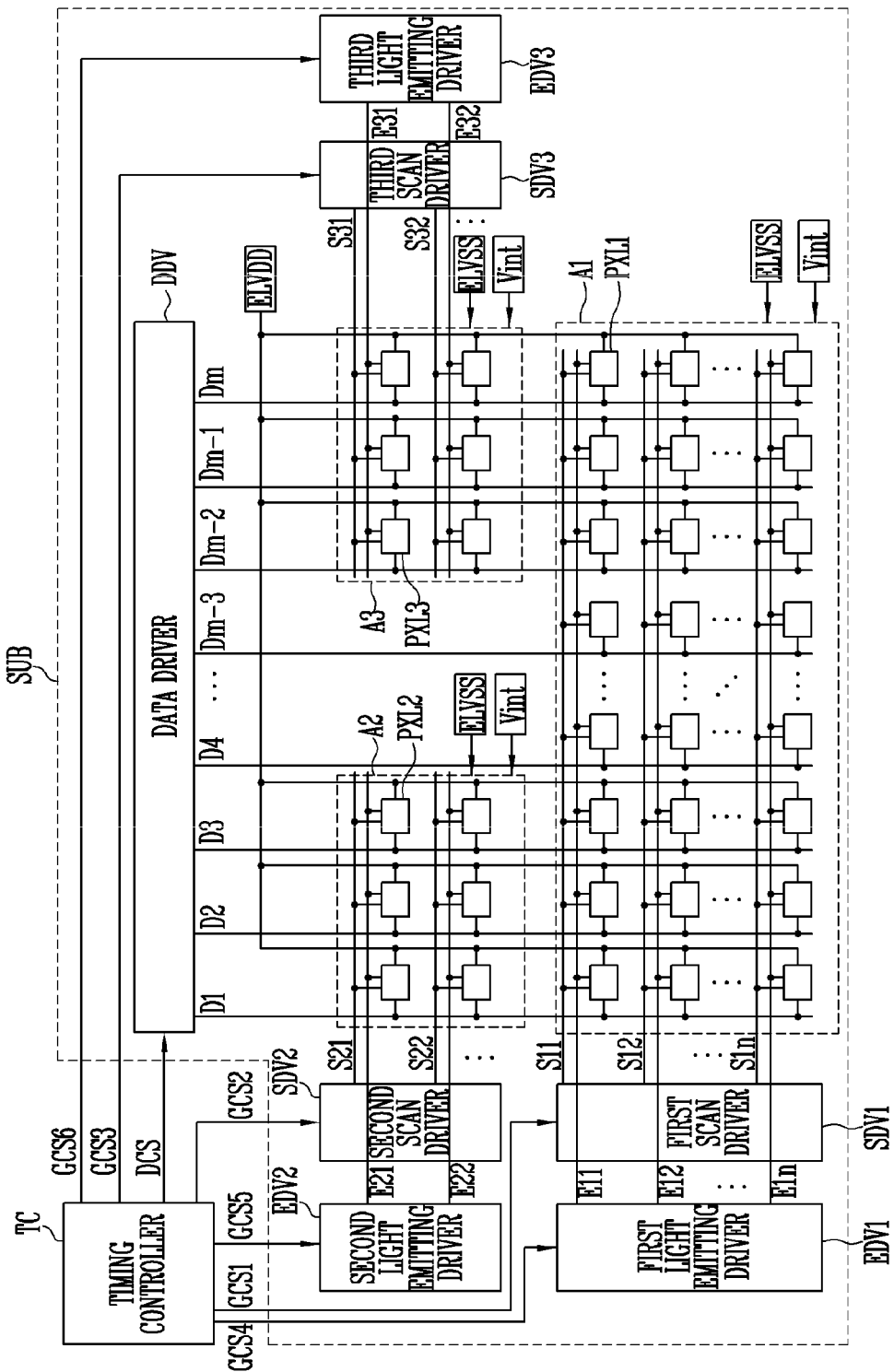
FIG. 2 is a block diagram illustrating pixels and a driver in a display device according to an embodiment of the present disclosure.

FIG. 2 is a block diagram illustrating pixels and a driver in a display device according to an embodiment of the present disclosure.

Referring to FIG. 2, the display device according to the embodiment of the present disclosure may include pixels PXL, a driver, and a line.

The pixels PXL may include first to third pixels PXL1, PXL2, and PXL3, and the driver may include first to third scan drivers SDV1, SDV2, and SDV3, first to third light emitting drivers EDV1, EDV2, and EDV3, a data driver DDV, and a timing controller TC. In FIG. 2, positions of the first to third scan drivers SDV1, SDV2, and SDV3, the first to third light emitting drivers EDV1, EDV2, and EDV3, the data driver DDV, and the timing controller TC are set for convenience of description. When an actual display device is implemented, the first to third scan drivers SDV1, SDV2, and SDV3, the first to third light emitting drivers EDV1, EDV2, and EDV3, the data driver DDV, and the timing controller TC may be disposed at other positions in the display device. For example, the data driver DDV is disposed in a region closer to a second region A2 and a third region A3 than a first region A1, but the present disclosure is not limited thereto. For example, it will be apparent that the data driver DDV may be disposed in a region adjacent to the first region A1.

The line provides signals of the driver to each pixel PXL, and may include scan lines, data lines, light emitting control lines, a power line, and an initialization power line (not shown). The scan lines may include first to third scan lines S11 to S1$n$, S21 and S22, and S31 and S32 respectively connected to the first to third pixels PXL1, PXL2, and PXL3, and the light emitting control lines may include first to third light emitting lines E11 to E1$n$, E21 and E22, and E31 and E32 respectively connected to the first to third pixels PXL1, PXL2 and PXL3. The data lines D1 to Dm and the power line may be connected to the first to third pixels PXL1, PXL2, and PXL3.

The first pixels PXL1 are located in a first pixel region PXA1. The first pixels PXL1 may be connected to the first scan lines S11 to S1$n$, the first light emitting control lines E1 to E1$n$, and the data lines D1 to Dm. The first pixels PXL1 receive a data signal supplied from the data lines D1 to Dm when a scan signal is supplied from the first scan lines S11 to S1$n$. Each of the first pixels PXL1 receiving the data signal may control the amount of current flowing in a second power source ELVSS via an organic light emitting device (not shown) from a first power source ELVDD.

The second pixels PXL2 are located in a second pixel region PXA2. The second pixels PXL2 are connected to the second scan lines S21 and S22, the second light emitting control lines E21 and E22, and the data lines D1 to D3. The second pixels PXL2 receive a data signal supplied from the data lines D1 to D3 when a scan signal is supplied from the second scan lines S21 and S22. Each of the second pixels PXL2 receiving the data signal may control the amount of current flowing in the second power source ELVSS via an organic light emitting device (not shown) from the first power source ELVDD.

Additionally, in FIG. 2, it has been illustrated that six second pixels PXL2 are located in the second pixel region PXA2 defined by the two second scan lines S21 and S22, the two second light emitting control lines E21 and E22, and the three data lines D1 to D3, but the present disclosure is not limited thereto. That is, a plurality of second pixels PXL2 may be arranged to correspond to the size of the second pixel region PXA2, and the number of second scan lines, second light emitting control lines, and data lines may be variously set corresponding to the number of second pixels PXL2.

The third pixels PXL3 are located in a third pixel region PXA3 defined by the third scan lines S31 and S32, the third light emitting control lines E31 and E32, and the data lines Dm−2 to Dm. The third pixels PXL3 receive a data signal supplied from the data lines Dm−2 to Dm when a scan signal is supplied from the third scan lines S31 and S32. Each of the third pixels PXL3 receiving the data signal may control the amount of current flowing in the second power source ELVSS via an organic light emitting device (not shown) from the first power source ELVDD.

Additionally, in FIG. 2, it has been illustrated that six third pixels PXL3 are located in the third pixel region PXA3 defined by the two third scan lines S31 and S32, the two third light emitting control lines E31 and E32, and the three data lines Dm−2 to Dm, but the present disclosure is not limited thereto. That is, a plurality of third pixels PXL3 may be arranged to correspond to the size of the third pixel region PXA3, and the number of third scan lines, third light emitting control lines, and data lines may be variously set corresponding to the number of third pixels PXL3.

The first scan driver SDV1 may supply a scan signal to the first scan lines S11 to S1$n$ in response to a first gate control signal GCS1 from the timing controller TC. For example, the first scan driver SDV1 may sequentially supply the scan signal to the first scan lines S11 to S1$n$. If the scan signal is sequentially supplied to the first scan lines S11 to S1$n$, the first pixels PXL1 may be sequentially selected by one horizontal line at a time.

The second scan driver SDV2 may supply a scan signal to the second scan lines S21 and S22 in response to a second gate control signal GCS2 from the timing controller TC. For example, the second scan driver SDV2 may sequentially supply the scan signal to the second scan lines S21 and S22. If the scan signal is sequentially supplied to the second scan lines S21 and S22, the second pixels PXL2 may be sequentially selected by one horizontal line at a time.

The third scan driver SDV3 may supply a scan signal to the third scan lines S31 and S32 in response to a third gate control signal GCS3 from the timing controller TC. For example, the third scan driver SDV3 may sequentially supply the scan signal to the third scan lines S31 and S32. If the scan signal is sequentially supplied to the third scan lines S31 and S32, the third pixels PXL3 may be sequentially selected by one horizontal line at a time.

The first light emitting driver EDV1 may supply a light emitting control signal to the first light emitting control lines E11 to E1$n$ in response to a fourth gate control signal GCS4. For example, the first light emitting driver EDV1 may sequentially supply the light emitting control signal to the first light emitting control lines E11 to E1$n$.

Here, the light emitting control signal may be set to have a wider width than the scan signal. For example, a light emitting control signal supplied to an ith (i is a natural number) first light emitting control line E1$i$ may be supplied to overlap with, for at least one period, a scan signal supplied to an (i−1)th first scan line S1$i$−1 and a scan signal supplied to an ith first scan line S1$i$.

The second light emitting driver EDV2 may supply a light emitting control signal to the second light emitting control lines E21 and E22 in response to a fifth gate control signal GCS5. For example, the second light emitting driver EDV2 may sequentially supply the light emitting control signal to the second light emitting control lines E21 and E22.

The third light emitting driver EDV3 may supply a light emitting control signal to the third light emitting control lines E31 and E32 in response to a sixth gate control signal GCS6. For example, the third light emitting driver EDV3 may sequentially supply the light emitting control signal to the third light emitting control lines E31 and E32.

Additionally, the light emitting control signal may be set to a gate-off voltage (e.g., a high voltage) such that transistors included in the pixels PXL can be turned off, and the scan signal may be set to a gate-on voltage (e.g., a low voltage) such that the transistors included in the pixels PXL can be turned on.

The data driver DDV may supply a data signal to the data lines D1 to Dm in response to a data control signal DCS. The data signal supplied to the data lines D1 to Dm may be supplied to pixels PXL selected by the scan signal.

The timing controller TC may supply, to the scan drivers SDV and the light emitting drivers EDV, the gate control signals GCS1 to GCS6 generated based on timing signals supplied from the outside, for example, a graphic controller. Also, the timing controller TC may supply the data control signal DCS to the data driver DDV.

A start pulse and clock signals may be included in each of the gate control signals GCS1 to GCS6. The start pulse may control a timing of a first scan signal or a first light emitting control signal. The clock signals may be used to shift the start pulse.

A source start pulse and clock signals may be included in the data control signal DCS. The source start pulse may control a sampling start time of data. The color signals may be used to control a sampling operation.

Meanwhile, when the display device is sequentially driven, the first scan driver SDV1 may receive, as a start pulse, the last output signal of the second scan driver SDV2. In this case, the first scan driver SDV1 and the second scan driver SDV2 may share control signals. Therefore, the timing controller TC may supply the gate control signal GCS2 to the second scan driver SDV2, and may not supply the gate control signal GCS1 to the first scan driver SDV1.

Similarly, when a separate scan driver for driving the first pixels PXL1 is added under the third scan driver SDV3, the added scan driver and the third scan driver SDV3 may share control signals. In addition, the added scan driver may receive, as a start pulse, the last scan signal of the third scan driver SDV3.

When the display device is sequentially driven, the first light emitting driver EDV1 may receive, as a start pulse, the last output signal of the second light emitting driver EDV2. In this case, the first light emitting driver EDV1 and the second light emitting driver EDV2 may share control signals. Therefore, the timing controller TC may supply the gate control signal GCS5 to the second light emitting driver EDV2, and may not supply the gate control signal GCS4 to the first light emitting driver EDV1.

Similarly, when a separate light emitting driver for driving the first pixels PXL1 is added under the third light emitting driver EDV3, the added light emitting driver and the third light emitting driver EDV3 may share control signals. In addition, the added light emitting driver may receive, as a start pulse, the last light emitting control signal of the third light emitting driver EDV3.

Figure 3:
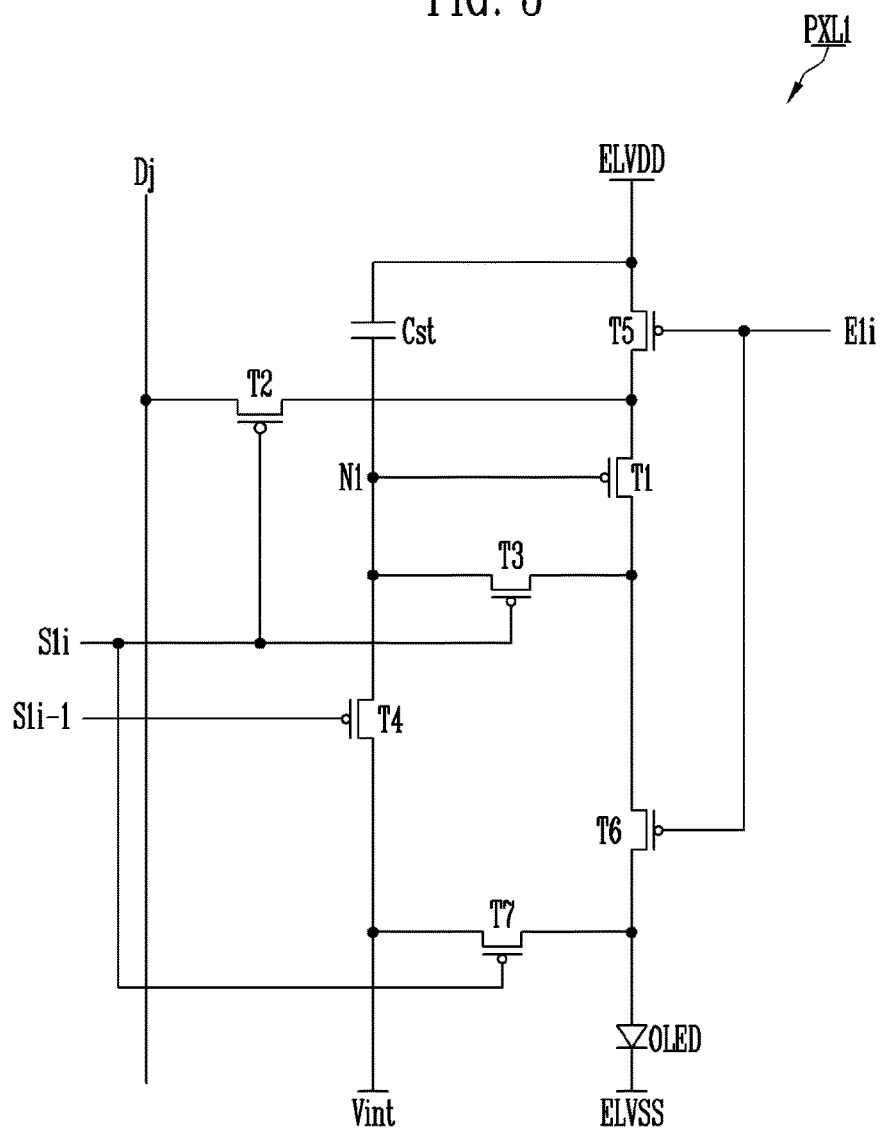
FIG. 3 is an equivalent circuit diagram illustrating an embodiment of a first pixel shown in FIG. 2.

FIG. 3 is an equivalent circuit diagram illustrating an embodiment of a first pixel shown in FIG. 2. For convenience of description, a pixel connected to a jth data line Dj and an ith first scan line S1i will be illustrated in FIG. 3.

Referring to FIGS. 2 and 3, the first pixel PXL1 according to the embodiment of the present disclosure may include an organic light emitting device OLED, first to seventh transistors T1 to T7, and a storage capacitor Cst.

An anode of the organic light emitting device OLED may be connected to the first transistor T1 via the sixth transistor T6, and a cathode of the organic light emitting device OLED may be connected to a second power source ELVSS. The organic light emitting device OLED may generate light with a predetermined luminance corresponding to the amount of current supplied from the first transistor T1.

A first power source ELVDD may be set to a higher voltage than the second power source ELVSS such that current can flow in the organic light emitting device OLED.

The seventh transistor T7 may be connected between an initialization power source Vint and the anode of the organic light emitting device OLED. In addition, a gate electrode of the seventh transistor T7 may be connected to the ith first scan line S1i. The seventh transistor T7 may be turned on when a scan signal is supplied to the ith first scan line S1i, to supply a voltage of the initialization power source Vint to the anode of the organic light emitting device OLED. Here, the initialization power source Vint may be set to a lower voltage than a data signal.

The sixth transistor T6 may be connected between the first transistor T1 and the organic light emitting device OLED. In addition, a gate electrode of the sixth transistor T6 may be connected to an ith first light emitting control line E1i. The sixth transistor T6 may be turned off when a light emitting control signal is supplied to the ith first light emitting control line E1i, and otherwise may be turned on.

The fifth transistor T5 may be connected between the first power source ELVDD and the first transistor T1. In addition, a gate electrode of the fifth transistor T5 may be connected to the ith first light emitting control line E1i. The fifth transistor T5 may be turned off when a light emitting control signal is supplied to the ith first light emitting control line E1i, and otherwise may be turned on.

A first electrode of the first transistor (drive transistor) T1 may be connected to the first power source ELVDD via the fifth transistor T5, and a second electrode of the first transistor T1 may be connected to the anode of the organic light emitting device OLED via the sixth transistor T6. In addition, a gate electrode of the first transistor T1 may be connected to a first node N1. The first transistor T1 may control the amount of current flowing in the second power source ELVSS via the organic light emitting device OLED from the first power source ELVDD, corresponding to a voltage of the first node N1.

The third transistor T3 may be connected between the second electrode of the first transistor T1 and the first node N1. In addition, a gate electrode of the third transistor T3 may be connected to the ith scan line S1i. The third transistor T3 may be turned on when a scan signal is supplied to the ith scan line S1i, to allow the second electrode of the first transistor T1 to be electrically connected to the first node N1. Therefore, the first transistor T1 may be diode-connected when the third transistor T3 is turned on.

The fourth transistor T4 may be connected between the first node N1 and the initialization power source Vint. In addition, a gate electrode of the fourth transistor T4 may be connected to an (i−1)th first scan line S1i−1. The fourth transistor T4 may be turned on when a scan signal is supplied to the (i−1)th first scan line S1i−1, to supply the voltage of the initialization power source Vint to the first node N1.

The second transistor T2 may be connected between the jth data line Dj and the first electrode of the first transistor T1. In addition, a gate electrode of the second transistor T2 may be connected to the ith first scan line S1i. The second transistor T2 may be turned on when a scan signal is supplied to the ith first scan line S1i, to allow the jth data line Dj to be electrically connected to the first electrode of the first transistor T1.

The storage capacitor Cst may be connected between the first power source ELVDD and the first node N1. The storage capacitor Cst may store a data signal and a voltage corresponding to a threshold voltage of the first transistor T1.

Meanwhile, each of the second and third pixels PXL2 and PXL3 may be implemented with the same circuit as the first pixel PXL1. Therefore, detailed descriptions of the second and third pixels PXL2 and PXL3 will be omitted.

As described above, according to an embodiment of the present disclosure, the pixels PXL may be provided in the regions A1, A2, and A3 having different areas. Lengths of the scan lines and light emitting control lines, which provide signals to the pixels PXL, may be changed depending on areas of the regions A1, A2, and A3, specifically the pixel regions PXA. For example, the first width W1 (see FIG. 1) of the first pixel region PXA1 is longer than the second width W2 (see FIG. 1) of the second pixel region PXA2. Accordingly, when the scan lines and the light emitting lines extend in the width direction of the pixel regions PXA, lengths of the first scan lines S11 to S1n and the first light emitting control lines E11 to E1n are longer than those of the second scan lines S21 and S22 and the second light emitting control lines E21 and E22, respectively. Differences between the scan lines and differences between the light emitting control lines may cause differences in load value between the scan lines and differences in load value between the light emitting control lines. That is, load values of the first scan lines S11 to S1n may be greater than those of the second scan lines S21 and S22. Also, load values of the first light emitting control lines E11 to E1n may be greater than those of the second light emitting control line E21 and E22. The differences in load value may cause a voltage difference of a data signal provided to each pixel PXL. The voltage difference of the data signal may cause a difference in luminance between the first pixels PXL1 of the first pixel region PXA1 and the second pixels PXL2 of the second pixel region PXA2.

According to another embodiment of the present disclosure, the extending directions of the scan lines and the light emitting control lines may be set different from each other. For example, unlike that, in the above-described embodiment, the scan lines and the light emitting control lines extend along the first direction DR1 as the width direction of the pixel regions PXA, the scan lines and the light emitting control lines may extend along the second direction DR2 as the length direction of the pixel regions PXA. Here, lengths of the scan lines and the light emitting control lines may be set to correspond to the first length L1 and the second length L2, respectively. Even in this case, differences in load value between the scan lines and differences in load value between the light emitting control lines may be caused by differences in length between the scan lines and differences in length between the light emitting control lines. As a result, differences in luminance between the pixels PXL may be caused.

In an embodiment of the present disclosure, a dummy part for compensating for a difference in load value is provided for each of the regions A1, A2, and A3, so that the regions A1, A2, and A3 are configured to have different parasitic capacitances. However, the dummy part for compensating for a difference in load value may not be provided. In the following embodiment, the structure of overall pixels PXL will be first described using the first pixel PXL1 as an example, and then differences between the first pixel PXL1 and the second pixel PXL2 will be mainly described. In an embodiment of the present disclosure, the third pixel PXL3 may be provided in the same form as the second pixel PXL2, and therefore, a description of the third pixel PXL3 will be omitted.

Figure 4:
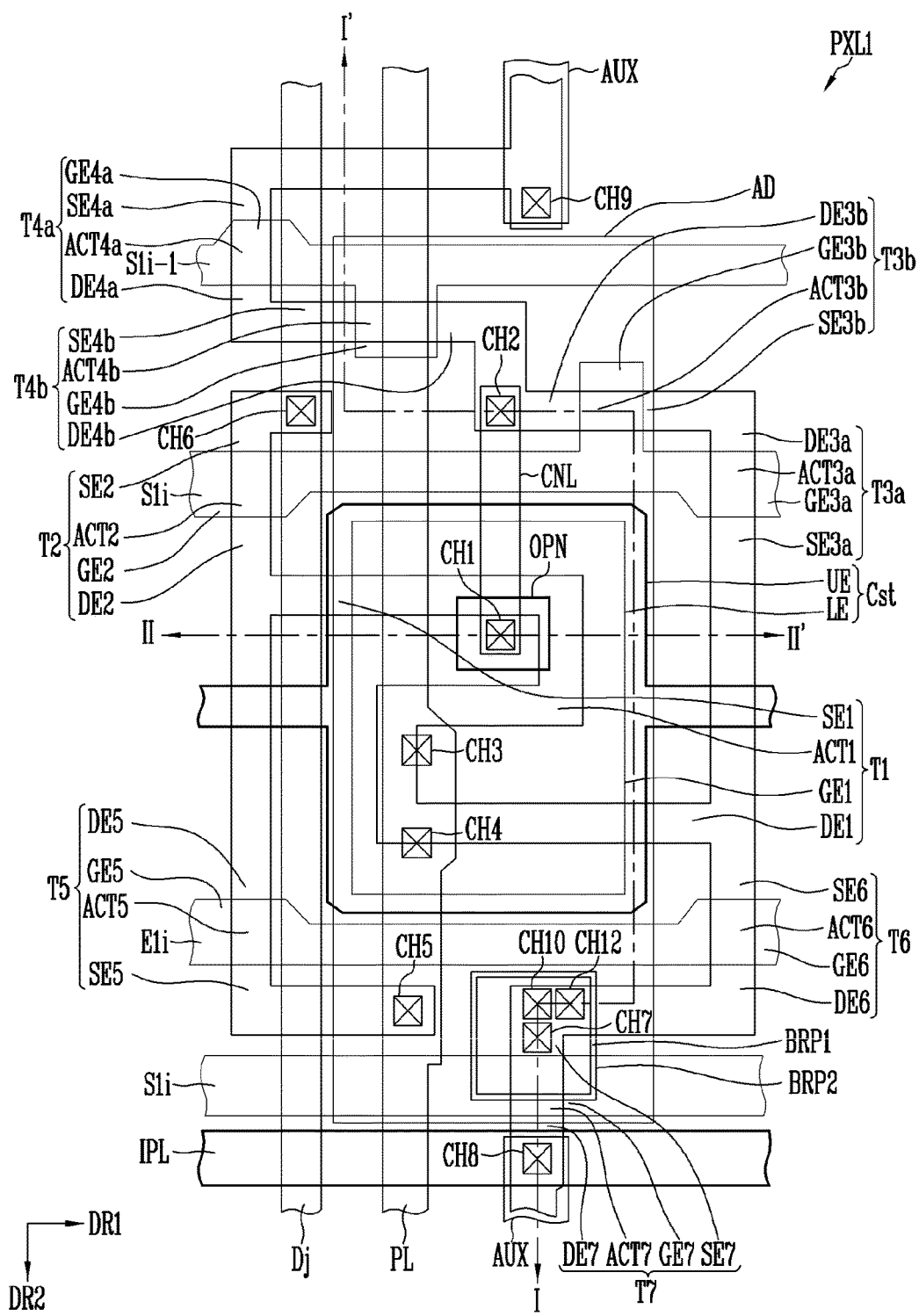
FIG. 4 is a plan view illustrating in detail the first pixel shown in FIG. 3.
Figure 5:
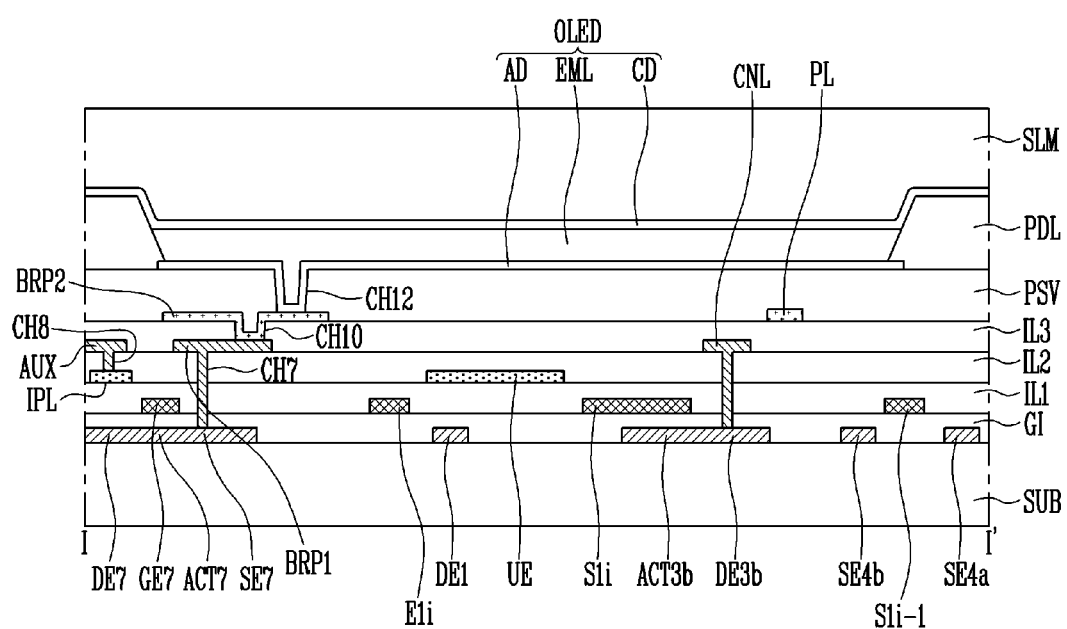
FIG. 5 is a sectional view taken along line I-I' of FIG. 4.
Figure 6:
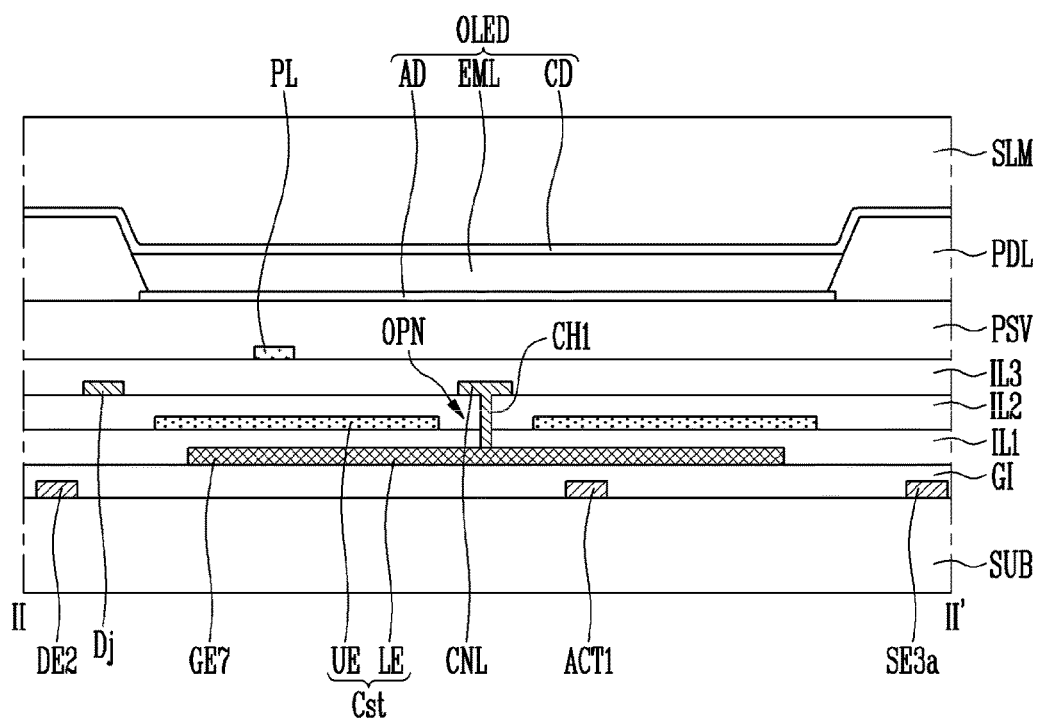
FIG. 6 is a sectional view taken along line II-II' of FIG. 4.

FIG. 4 is a plan view illustrating in detail the first pixel shown in FIG. 3. FIG. 5 is a sectional view taken along line I-I' of FIG. 4. FIG. 6 is a sectional view taken along line II-II' of FIG. 4.

Based on one first pixel PXL1 disposed on an ith row and a jth column in the first pixel region PXA1, two first scan lines S1i−1 and S1i, a first light emitting control line E1i, a power line PL, and a data line Dj are illustrated in FIGS. 4 to 6. In FIGS. 4 to 6, for convenience of description, a first scan line on an (i−1)th row is referred to as an "(i−1)th first scan line S1i−1," a first scan line on the ith row is referred to as an "ith first scan line S1i," a first light emitting control line on the ith row is referred to as a "first light emitting control line E1i," a data line on the jth column is referred to as a "data line Dj," and a power line on the jth column is referred to as a "power line PL."

Referring to FIGS. 4 to 6, the display device may include a substrate SUB, a line, and pixels, e.g., first pixels PXL1.

The substrate SUB may include a transparent insulating material such that light can be transmitted therethrough. The substrate SUB may be a rigid substrate. For example, the substrate SUB may be one of a glass substrate, a quartz substrate, a glass ceramic substrate, and a crystalline glass substrate.

In addition, the substrate SUB may be a flexible substrate. Here, the substrate SUB may be one of a film substrate including a polymer organic material and a plastic substrate. For example, the substrate SUB may include at least one selected from the group consisting of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and may include a fiber reinforced plastic (FRP), etc.

The line provides a signal to each of the first pixels PXL1, and may include first scan lines S1i−1 and S1i, a data line Dj, a first light emitting control line E1i, a power line PL, and an initialization power line IPL.

The first scan lines S1i−1 and S1i may extend in the first direction DR1. The first scan lines S1i−1 and S1i may include an (i−1)th first scan line S1i−1 and an ith first scan line S1i, which are sequentially arranged along the second direction DR2. The first scan lines S1i−1 and S1i may receive a scan signal. For example, the (i−1)th first scan line S1i−1 may receive an (i−1)th scan signal. First pixels PXL1 on an ith row may be initialized by the (i−1)th scan signal applied to the (i−1)th first scan line S1i−1. The ith first scan line S1i may receive an ith scan signal. The ith first scan line S1i may be divided into two lines to be respectively connected to different transistors.

The first light emitting control line E1i may extend in the first direction DR1. The first light emitting control line E1i is disposed to be spaced apart from the two ith first scan lines S1i between the ith first scan lines S1i. The first light emitting control line E1i may receive a light emitting control signal.

The data line Dj may extend in the second direction DR2. The data line Dj may receive a data signal.

The power line PL may extend in the second direction DR2. The power line PL may be disposed to be spaced apart from the data line Dj. The power line PL may receive the first power source ELVDD.

The initialization power line IPL may extend along the first direction DR1. The initialization power line IPL may be provided between a first pixel PXL on an ith pixel row and a first pixel PXL1 on an (i+1)th pixel row. The initialization power line IPL may receive the initialization power source Vint.

Each of the first pixels PXL1 may include first to seventh transistors T1 to T7, a storage capacitor Cst, and a light emitting device OLED.

The first transistor T1 may include a first gate electrode GE1, a first active pattern ACT1, a first source electrode SE1, a first drain electrode DE1, and a connection line CNL.

The first gate electrode GE1 may be connected to a third drain electrode DE3 of the third transistor T3 and a fourth drain electrode DE4 of the fourth transistor T4. The connection line CNL may connect between the first gate electrode GE1 and the third and fourth drain electrodes DE3 and DE4. One end of the connection line CNL may be connected to the first gate electrode GE1 through a first contact hole CH1, and the other end of the connection line CNL may be connected to the third and fourth drain electrodes DE3 and DE4 through a second contact hole CH2.

In an embodiment of the present disclosure, the first active pattern ACT1, the first source electrode SE1, and the first drain electrode DE1 may be formed of a semiconductor layer undoped or doped with impurities. For example, the first source electrode SE1 and the first drain electrode DE1 may be formed of a semiconductor layer doped with impurities, and the active pattern ACT1 may be formed of a semiconductor layer undoped with impurities.

The first active pattern ACT1 has a bar shape extending in a predetermined direction, and may have a shape in which it is bent plural times along the extending direction. The first active pattern ACT1 may overlap with the first gate electrode GE1 in a plan view. As the first active pattern ACT1 is formed long, a channel region of the first transistor T1 can be formed long. Thus, the driving range of a gate voltage applied to the first transistor T1 is widened. Accordingly, the gray scale of light emitted from the light emitting device OLED can be minutely controlled.

The first source electrode SE1 may be connected to one end of the first active pattern ACT1. The first source electrode SE1 may be connected to a second drain electrode DE2 of the second transistor T2 and a fifth drain electrode DE5 of the fifth transistor T5. The first drain electrode DE1 may be connected to the other end of the first active pattern ACT1. The first drain electrode DE1 may be connected to a third source electrode SE3 of the third transistor T3 and a sixth source electrode SE6 of the sixth transistor T6.

The second transistor T2 may include a second gate electrode GE2, a second active pattern ACT2, and a second source electrode SE2, and the second drain electrode DE2.

The second gate electrode GE2 may be connected to the ith first scan line S1i. The second gate electrode GE2 may be provided as a portion of the ith first scan line S1i or may be provided in a shape protruding from the ith first scan line S1i. In an embodiment of the present disclosure, the second active pattern ACT2, the second source electrode SE2, and the second drain electrode DE2 may be formed of a semiconductor undoped or doped with impurities. For example, the second source electrode SE2 and the second drain electrode DE2 may be formed of a semiconductor doped with impurities, and the second active pattern ACT2 may be formed of a semiconductor layer undoped with impurities. The second active pattern ACT2 corresponds to a portion overlapping with the second gate electrode GE2. One end of the second source electrode SE2 may be connected to the second active pattern ACT2. The other end of the second source electrode SE2 may be connected to the data line Dj through a sixth contact hole CH6. One end of the second drain electrode DE2 may be connected to the second active pattern ACT2. The other end of the second drain electrode DE2 may be connected to the first source electrode SE1 of the first transistor T1 and the fifth drain electrode DE5 of the fifth transistor T5.

The third transistor T3 may be provided in a double gate structure so as to prevent a leakage current. That is, the third transistor T3 may include a 3ath transistor T3a and a 3bth transistor T3b. The 3ath transistor T3a may include a 3ath gate electrode GE3a, a 3ath active pattern ACT3a, a 3ath source electrode SE3a, and a 3ath drain electrode DE3a. The 3bth transistor T3b may include a 3bth gate electrode GE3b, a 3bth active pattern ACT3b, a 3bth source electrode SE3b, and a 3bth drain electrode DE3b. Hereinafter, the 3ath gate electrode GE3a and the 3bth gate electrode GE3b are referred to as a third gate electrode GE3, the 3ath active pattern ACT3a and the 3bth active pattern ACT3b are referred to as a third active pattern ACT3, the 3ath source electrode SE3a and the 3bth source electrode SE3b are referred to as the third source electrode SE3, and the 3ath drain electrode DE3a and the 3bth drain electrode DE3b are referred to as the third drain electrode DE3.

The third gate electrode GE3 may be connected to the ith first scan line S1i. The third gate electrode GE3 may be provided as a portion of the ith first scan line S1i or may be provided in a shape protruding from the ith first scan line S1i. For example, the 3bth gate electrode GE3b may be provided in a shape protruding from the ith first scan line S1i, and the 3ath gate electrode GE3a may be provided as a portion of the ith first scan line S1i.

The third active pattern ACT, the third source electrode SE3, and the third drain electrode DE3 may be formed of a semiconductor layer undoped or doped with impurities. For example, the third source electrode SE3 and the third drain electrode DE3 may be formed of a semiconductor layer doped with impurities, and the third active pattern ACT3 may be formed of a semiconductor layer undoped with impurities. The third active pattern ACT3 corresponds to a portion overlapping with the third gate electrode GE3. One end of the third source electrode SE3 may be connected to the third active pattern ACT3. The other end of the third source electrode SE3 may be connected to the first drain electrode DE1 of the first transistor T1 and the sixth source electrode SE6 of the sixth transistor T6. One end of the third drain electrode DE3 may be connected to the third active pattern ACT3. The other end of the third drain electrode DE3 may be connected to the fourth drain electrode DE4 of the fourth transistor T4. Also, the third drain electrode DE3 may be connected to the first gate electrode GE1 of the first transistor T1 through the connection line CNL, the second contact hole CH2, and the first contact hole CH1.

The fourth transistor T4 may be provided in a double gate structure so as to prevent a leakage current. That is, the fourth transistor T4 may include a 4ath transistor T4a and a 4bth transistor T4b. The 4ath transistor T4a may include a 4ath gate electrode GE4a, a 4ath active pattern ACT4a, a 4ath source electrode SE4a, and a 4ath drain electrode DE4a, and the 4bth transistor T4b may include a 4bth gate electrode GE4b, a 4bth active pattern ACT4b, a 4bth source electrode SE4b, and a 4bth drain electrode DE4b. Hereinafter, the 4ath gate electrode GE4a and the 4bth gate electrode GE4b are referred to as a fourth gate electrode GE4, the 4ath active pattern ACT4a and the 4bth active pattern ACT4b are referred to as a fourth active pattern ACT4, the 4ath source electrode SE4a and the 4bth source electrode SE4b are referred to as a fourth source electrode SE4, and the 4ath drain electrode DE4a and the 4bth drain electrode DE4b are referred to as the fourth drain electrode DE4.

The fourth gate electrode GE4 may be connected to the (i−1)th first scan line S1i−1. The fourth gate electrode GE4 may be provided as a portion of the (i−1)th first scan line S1i−1 or may be provided in a shape protruding from the (i−1)th first scan line S1i−1. For example, the 4ath gate electrode GE4a may be provided as a portion of the (i−1)th first scan line S1i−1. The 4bth gate electrode GE4b may be provided in a shape protruding from the (i−1)th first scan line S1i−1.

The fourth active pattern ACT4, the fourth source electrode SE4, and the fourth drain electrode DE4 may be formed of a semiconductor layer undoped or doped with impurities. For example, the fourth source electrode SE4 and the fourth drain electrode DE4 may be formed of a semiconductor layer doped with impurities, and the fourth active pattern ACT4 may be formed of a semiconductor layer undoped with impurities. The fourth active pattern ACT4 corresponds to a portion overlapping with the fourth gate electrode GE4.

One end of the fourth source electrode SE4 may be connected to the fourth active pattern ACT4. The other end of the fourth source electrode SE4 may be connected to an initialization power line IPL of a first pixel PXL1 on an (i−1)th row and a seventh drain electrode DE7 of a seventh transistor T7 of the first pixel PXL1 on the (i−1)th row. An auxiliary connection line AUX may be provided between the fourth source electrode SE4 and the initialization power line IPL. One end of the auxiliary connection line AUX may be connected to the fourth source electrode SE4 through a ninth contact hole CH9. The other end of the auxiliary connection line AUX may be connected to an initialization power line IPL on the (i−1)th row through an eighth contact hole CH8 of the first pixel PXL1 on the (i−1)th row. One end of the fourth drain electrode DE4 may be connected to the fourth active pattern ACT4. The other end of the fourth drain electrode DE4 may be connected to the third drain electrode DE3 of the third transistor T3. Also, the fourth drain electrode DE4 may be connected to the first gate electrode GE1 of the first transistor T1 through the second contact hole CH2 and the first contact hole CH1.

The fifth transistor T5 may include a fifth gate electrode GE5, a fifth active pattern ACT5, a fifth source electrode SE5, and the fifth drain electrode DE5.

The fifth gate electrode GE5 may be connected to the first light emitting control line E1i. The fifth gate electrode GE5 may be provided as a portion of the first light emitting control line E1i or may be provided in a shape protruding from the first light emitting control line E1i. The fifth active pattern ACT, the fifth source electrode SE5, and the fifth drain electrode DE5 may be formed of a semiconductor layer undoped or doped with impurities. For example, the fifth source electrode SE5 and the fifth drain electrode DE5 may be formed of a semiconductor layer doped with impurities, and the fifth active pattern ACT5 may be formed of a semiconductor layer undoped with impurities. The fifth active pattern ACT5 corresponds to a portion overlapping with the fifth gate electrode GE5. One end of the fifth source electrode SE5 may be connected to the fifth active pattern ACT5. The other end of the fifth source electrode SE5 may be connected the power line PL through a fifth contact hole CH5. One end of the fifth drain electrode DE5 may be connected to the fifth active pattern ACT5. The other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode SE6 may be connected to the first light emitting control line E1i. The sixth gate electrode SE6 may be provided as a portion of the first light emitting control line E1i or may be provided in a shape protruding from the first light emitting control line E1i. The sixth active pattern ACT6, the sixth source electrode SE6, and the sixth drain electrode DE6 may be formed of a semiconductor layer undoped or doped with impurities. For example, the sixth source electrode SE6 and the sixth drain electrode DE6 may be formed of a semiconductor layer doped with impurities, and the sixth active pattern ACT6 may be formed of a semiconductor layer undoped with impurities. The sixth active pattern ACT6 corresponds to a portion overlapping with the sixth gate electrode GE6. One end of the sixth source electrode SE6 may be connected to the sixth active pattern ACT6. The other end of the sixth source electrode SE6 may be connected to the first drain electrode DE1 of the first transistor T1 and the third source electrode SE3 of the third transistor T3. One end of the sixth drain electrode DE6 may be connected to the sixth active pattern ACT6. The other end of the sixth drain electrode DE6 may be connected to a seventh source electrode SE7 of the seventh transistor T7.

The seventh transistor T7 may include a seventh gate electrode GE7, a seventh active pattern ACT7, the seventh source electrode SE7, and a seventh drain electrode DE7.

The seventh gate electrode GE7 may be connected to the ith first scan line S1i. The seventh gate electrode GE7 may be provided as a portion of the ith first scan line S1i or may be provided in a shape protruding from the ith first scan line S1i. The seventh active pattern ACT7, the seventh source electrode SE7, and the seventh drain electrode DE7 may be formed of a semiconductor layer undoped or doped with impurities. For example, the seventh source electrode SE7 and the seventh drain electrode DE7 may be formed of a semiconductor layer doped with impurities, and the seventh active layer ACT7 may be formed of a semiconductor layer undoped with impurities. The seventh active pattern ACT7 corresponds to a portion overlapping with the seventh gate electrode GE7. One end of the seventh source electrode SE7 may be connected to the seventh active pattern ACT7. The other end of the seventh source electrode SE7 may be connected to the sixth drain electrode DE6 of the sixth transistor T6. One end of the seventh drain electrode DE7 may be connected to the seventh active pattern ACT7. The other end of the seventh drain electrode DE7 may be connected to the initialization power line IPL. Also, the seventh drain electrode DE7 may be connected to a fourth source electrode SE4 of a fourth transistor T4 of a first pixel PXL on an (i+1)th row. The seventh drain electrode DE7 may be connected to the fourth source electrode SE4 of the fourth transistor T4 of the first pixel PXL on the (i+1)th row through the auxiliary connection line AUX, the eighth contact hole CH8, and the ninth contact hole CH9.

The storage capacitor Cst may include a lower electrode LE and an upper electrode UE. The lower electrode LE may be formed as the first gate electrode GE1 of the first transistor T1.

The upper electrode UE overlaps with the first gate electrode GE1, and may cover the lower electrode LE when viewed on a plane. As the overlapping area of the upper electrode UE and the lower electrode LE is widened, the capacitance of the storage capacitor Cst may be increased. The upper electrode UE may extend in the first direction DR1. In an embodiment of the present disclosure, a voltage having the same level as the first power source may be applied to the upper electrode UE. The upper electrode UE may have an opening OPN in a region including the first contact hole CH1 through which the first gate electrode GE1 and the connection line CNL contact each other.

The light emitting device OLED may include a first electrode AD, a second electrode CD, and a light emitting layer EML provided between the first electrode AD and the second electrode CD.

The first electrode AD may be provided in a light emitting region corresponding to each pixel PXL1. The first electrode AD may be connected to the seventh source electrode SE7 of the seventh transistor T7 and the sixth drain electrode DE6 of the sixth transistor T6 through a seventh contact hole CH7 and a tenth contact hole CH10. A first bridge pattern BRP1 may be provided between the seventh contact hole CH7 and the tenth contact hole CH10. The first bridge pattern BRP1 may connect the first electrode AD to the sixth drain electrode DE6 and the seventh source electrode SE7.

Hereinafter, a structure of the display device according to the embodiment of the present disclosure will be described along a stacking order with reference to FIGS. 4 to 6.

Active patterns ACT1 to ACT7 (hereinafter, referred to as ACT) may be provided on a substrate SUB. The active patterns may include first to seventh active patterns ACT1 to ACT7. The first to seventh active patterns ACT1 to ACT7 may include a semiconductor material.

A buffer layer (not shown) may be further provided between the substrate SUB and the first to seventh active patterns ACT1 to ACT7.

A gate insulating layer GI may be provided on the substrate SUB on which the first to seventh active patterns ACT1 to ACT7 are formed.

An (i−1)th first scan line S1$i$−1, an ith first scan line S1$i$, a light emitting control line E1$i$, and first to seventh gate electrodes GE1 to GE7 may be provided on the gate insulating layer GI. The first gate electrode GE1 may be a lower electrode LE of a storage capacitor Cst. The second gate electrode GE2 and the third gate electrode GE3 may be integrally formed with an ith first scan line S1$i$. The fourth gate electrode GE4 may be integrally formed with the (i−1)th first scan line S1$i$−1. The fifth gate electrode GE5 and the sixth gate electrode GE6 may be integrally formed with the light emitting control line E1$i$. The seventh gate electrode GE7 may be integrally formed with the ith first scan line S1$i$.

A first interlayer insulating layer IL1 may be provided on the substrate SUB on which the (i−1)th first scan line S1$i$−1 and the like are formed.

An upper electrode UE of the storage capacitor Cst and an initialization power line IPL may be provided on the first interlayer insulating layer IL1. The upper electrode UE may cover the lower electrode LE. The upper electrode UE and the lower electrode LE may constitute the storage capacitor Cst with the first interlayer insulating layer IL1 interposed therebetween.

A second interlayer insulating layer IL2 may be provided on the substrate SUB on which the upper electrode UE and the initialization power line IPL are disposed.

A data line Dj, a connection line CNL, an auxiliary connection line AUX, and a first bridge pattern BRP1 may be provided on the second interlayer insulating layer IL2.

The data line Dj may be connected to a second source electrode SE2 through a sixth contact hole CH6 passing through the first interlayer insulating layer IL1, the second interlayer insulating layer IL2, and the gate insulating layer GI.

The connection line CNL may be connected to the first gate electrode GE1 through a first contact hole CH1 passing through the first interlayer insulating layer IL1 and the second interlayer insulating layer IL2. Also, the connection line CNL may be connected to a third drain electrode DE3 and a fourth drain electrode DE4 through a second contact hole CH2 passing through the gate insulating layer GI, the first interlayer insulating layer IL1, and the second interlayer insulating layer IL2.

The auxiliary connection line AUX may be connected to the initialization power line IPL through an eighth contact hole CH8 passing through the second interlayer insulating layer IL2. Also, the auxiliary connection line AUX may be connected to a fourth source electrode SE4 and a seventh drain electrode DE7 of a first pixel PXL1 on an (i−1)th row through a ninth contact hole CH9 passing through the gate insulating layer GI, the first interlayer insulating layer IL1, and the second interlayer insulating layer IL2.

The first bridge pattern BRP1 may be a pattern provided as a medium connecting a sixth drain electrode DE6 to a first electrode AD between the sixth drain electrode DE6 and the first electrode AD. The first bridge pattern BRP1 may be connected to the sixth drain electrode DE6 and a first source electrode SE1 through a seventh contact hole CH7 passing through the gate insulating layer GI, the first interlayer insulating layer IL1, and the second interlayer insulating layer IL2.

A third interlayer insulating layer IL3 may be provided on the substrate SUB on which the data line Dj and the like are formed.

A power line PL and a second bridge pattern BRP2 may be provided on the third interlayer insulating layer IL3. The second bridge pattern BRP2 may be connected to the first bridge pattern BRP1 through a tenth contact hole CH10.

The power line PL may be connected to the upper electrode UE of the storage capacitor Cst through third and fourth contact holes CH3 and CH4 passing through the second interlayer insulating layer IL2. The power line PL may be connected to a fifth source electrode SE5 through a fifth contact hole CH5 passing through the first interlayer insulating layer IL1, the second interlayer insulating layer IL2, the third interlayer insulating layer IL3, and the gate insulating layer GI.

A protective layer PSV may be provided on the third interlayer insulating layer IL3 on which the power line PL and the second bridge pattern BRP2 are provided.

A light emitting device OLED may be provided on the protective layer PSV. The light emitting device OLED may include the first electrode AD, a second electrode CD, and a light emitting layer EML provided between the first electrode AD and the second electrode CD.

The first electrode AD may be provided on the protective layer PSV. The first electrode AD may be connected to the second bridge pattern BRP2 through a twelfth contact hole CH12 passing through the protective layer PSV. Thus, the first electrode AD can be electrically connected to the first bridge pattern BRP1. Since the first bridge pattern BRP1 is connected to the sixth drain electrode DE6 and the seventh source electrode SE7 through the seventh contact hole CH7, the first electrode AD can be finally connected to the sixth drain electrode DE6 and the seventh source electrode SE7.

A pixel defining layer PDL defining a light emitting region to correspond to each pixel PXL may be provided on the substrate SUB on which the first electrode AD and the like are formed. The pixel defining layer PDL may protrude from the substrate SUB along the circumference of the pixel PXL while exposing a top surface of the first electrode AD.

The light emitting layer EML may be provided in the light emitting region surrounded by the pixel defining layer PDL, and the second electrode CD may be provided on the light emitting layer EML. An encapsulation layer SLM covering the second electrode CD may be provided on the second electrode CD.

One of the first electrode AD and the second electrode CD may be an anode electrode, and the other of the first electrode AD and the second electrode CD may be a cathode electrode. For example, the first electrode AD may be an anode electrode, and the second electrode CD may be a cathode electrode.

In addition, at least one of the first electrode AD and the second electrode CD may be a transmissive electrode. For example, when the light emitting device OLED is a bottom-emission organic light emitting device, the first electrode AD may be a transmissive electrode, and the second electrode CD is a reflective electrode. When the light emitting device OLED is a top-emission organic light emitting device, the first electrode AD may be a reflective electrode, and the second electrode CD may be a transmissive electrode. When the light emitting device OLED is a dual-emission light emitting device, both of the first electrode AD and the second electrode CD may be transmissive electrodes. In this embodiment, a case where the light emitting device OLED is a top-emission organic light emitting device, and the first electrode AD is an anode electrode will be described as an example.

The first electrode AD may include a reflective layer (not shown) capable of reflecting light and a transparent conductive layer (not shown) disposed over or under the reflective layer. At least one of the transparent conductive layer and the reflective layer may be connected to the seventh source electrode SE7.

The reflective layer may include a material capable of reflecting light. For example, the reflective layer may include at least one selected from the group consisting of aluminum (Al), silver (Ag), chromium (Cr), molybdenum (Mo), platinum (Pt), nickel (Ni), and alloys thereof.

The transparent conductive layer may include a transparent conductive oxide. For example, the transparent conductive layer may include at least one transparent conductive oxide selected from the group consisting of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The pixel defining layer PDL may include an organic insulating material. For example, the pixel defining layer PDL may include at least one selected from the group consisting of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The light emitting layer EML may be disposed on the exposed surface of the first electrode AD. The light emitting layer EML may have a multi-layered thin film structure at least including a light generation layer (LGL). For example, the light emitting layer EML may include a hole injection layer (HIL) for injecting holes, a hole transport layer (HTL) having an excellent hole transporting property, the HTL for increasing the opportunity for holes and electrons to be re-combined by suppressing the movement of electrons that fail to be combined in the LGL, the LGL for emitting light through the re-combination of the injected electrons and holes, a hole blocking layer (HBL) for suppressing the movement of holes that fail to be combined in the LGL, an electron transport layer (ETL) smoothly transporting electrons to the LGL, and an electron transport layer (EIL) for injecting electrons. In the light emitting layer EML, the HIL, HTL, HBL, ETL, and EIL may be common layers commonly disposed in first pixels PXL1 adjacent to each other.

The color of light generated in the LGL may be one of red, green, blue, and white, but the present disclosure is not limited thereto. For example, the color of light generated in the LGL of the light emitting layer EML may also be one of magenta, cyan, and yellow.

The second electrode CD may be a semi-transmissive reflective layer. For example, the second electrode CD may be a thin metal layer having a thickness, through which light emitted from the light emitting layer EML can be transmitted. The second electrode CD may transmit a portion of the light emitted from the light emitting layer EML therethrough, and may reflect the rest of the light emitted from the light emitting layer EML.

The second electrode CD may include a material having a lower work function than the transparent conductive layer. For example, the second electrode CD may be include at least one selected from the group consisting of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof.

A portion of the light emitted from the light emitting layer EML may not be transmitted through the second electrode CD, and the light reflected from the second electrode CD may be again reflected from the reflective layer. That is, the light emitted from the light emitting layer EML may resonate between the reflective layer and the second electrode CD. The light extraction efficiency of the light emitting device OLED can be improved by the resonance of the light.

The distance between the reflective layer and the second electrode CD may be changed depending on a color of the light emitted from the light emitting layer EML. That is, the distance between the reflective layer and the second electrode CD may be adjusted to correspond to a resonance distance, depending on a color of the light emitted from the light emitting layer EML.

The encapsulation layer SLM can prevent oxygen and moisture from diffusion into the light emitting device OLED. The encapsulation layer SLM may include a plurality of inorganic layers (not shown) and a plurality of organic layers (not shown). For example, the encapsulation layer SLM may include a plurality unit encapsulation layers including the inorganic layer and the organic layer disposed on the inorganic layer. In addition, the inorganic layer may be disposed at the uppermost portion of the encapsulation layer SLM. The inorganic layer may include at least one selected from the group consisting of silicon oxide, silicon nitride, silicon oxynitride, aluminum oxide, titanium oxide, zirconium oxide, and tin oxide.

In an embodiment of the present disclosure, the second pixel PXL2 provided in the second pixel region PXA2 and the third pixel PXL3 provided in the third pixel region PXA3 have the substantially same pixel structure as the first pixel PXL1, and therefore, their descriptions will be omitted.

Figure 7:
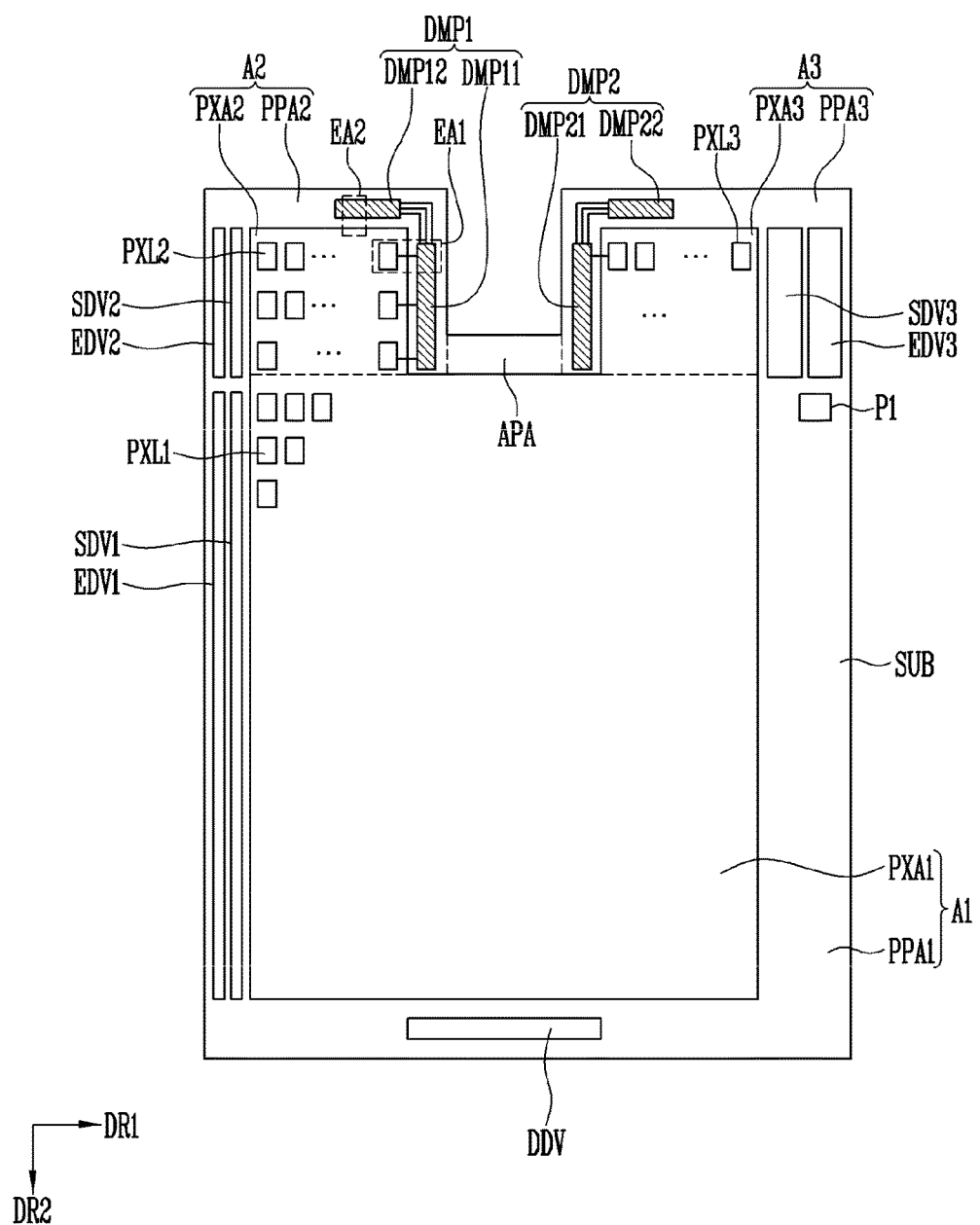
FIG. 7 is a plan view illustrating a display device according to an embodiment of the present disclosure.
Figure 8:
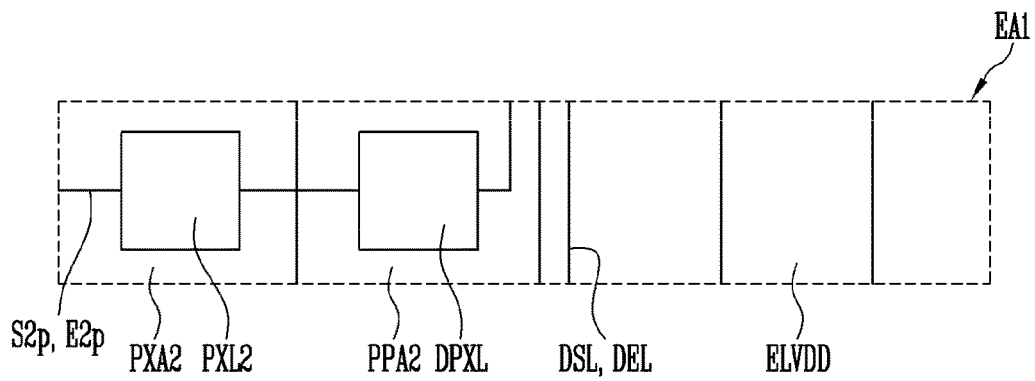
FIG. 8 is an enlarged view of region EA1 of FIG. 7.
Figure 9:
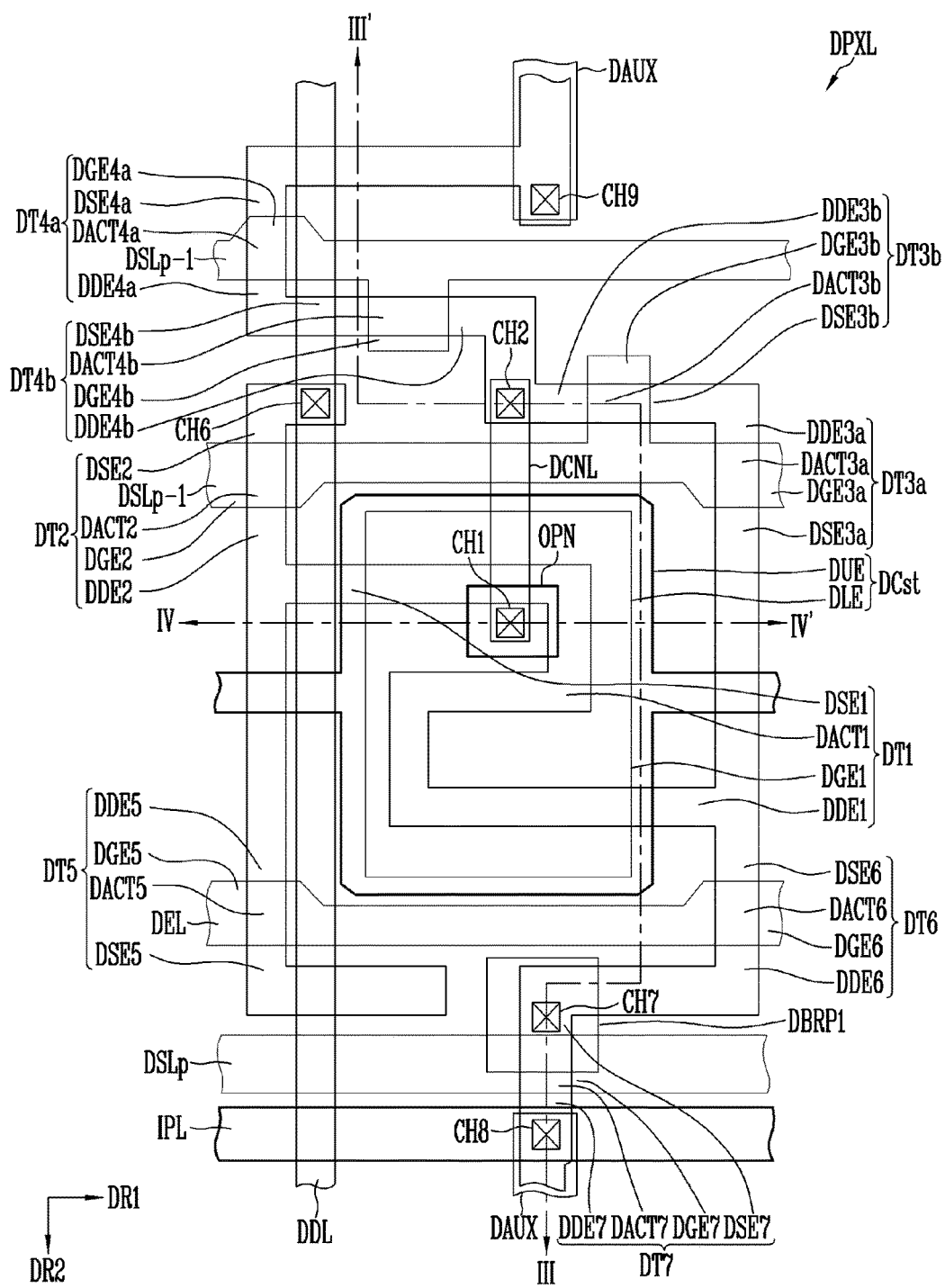
FIG. 9 is a plan view illustrating a dummy pixel of FIG. 8.
Figure 10:
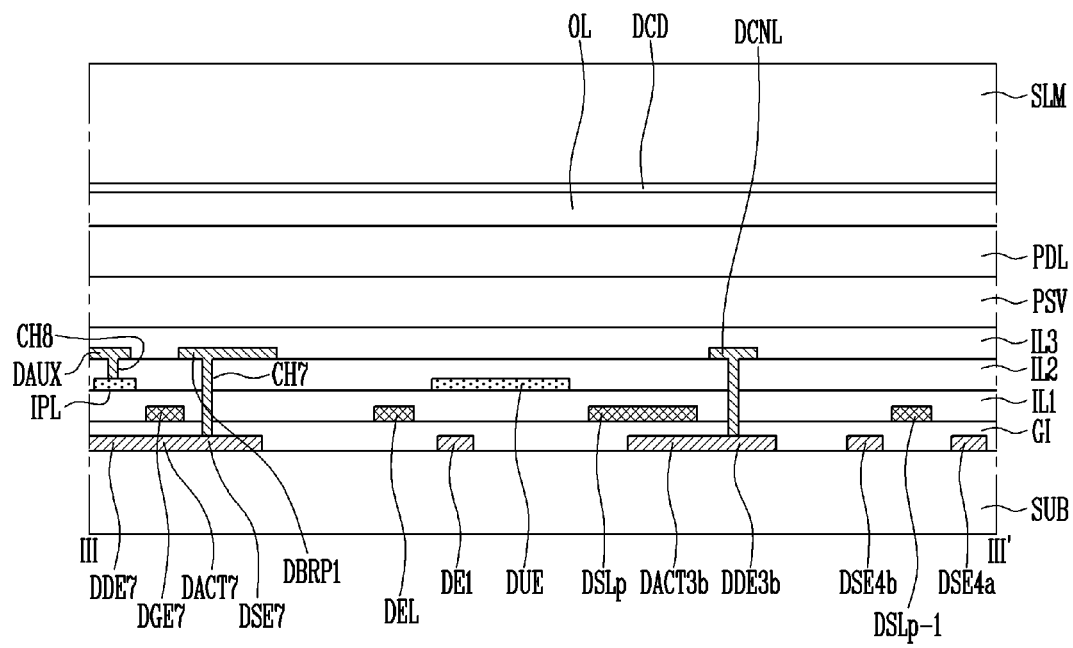
FIG. 10 is a sectional view taken along line III-III' of FIG. 9.
Figure 11:
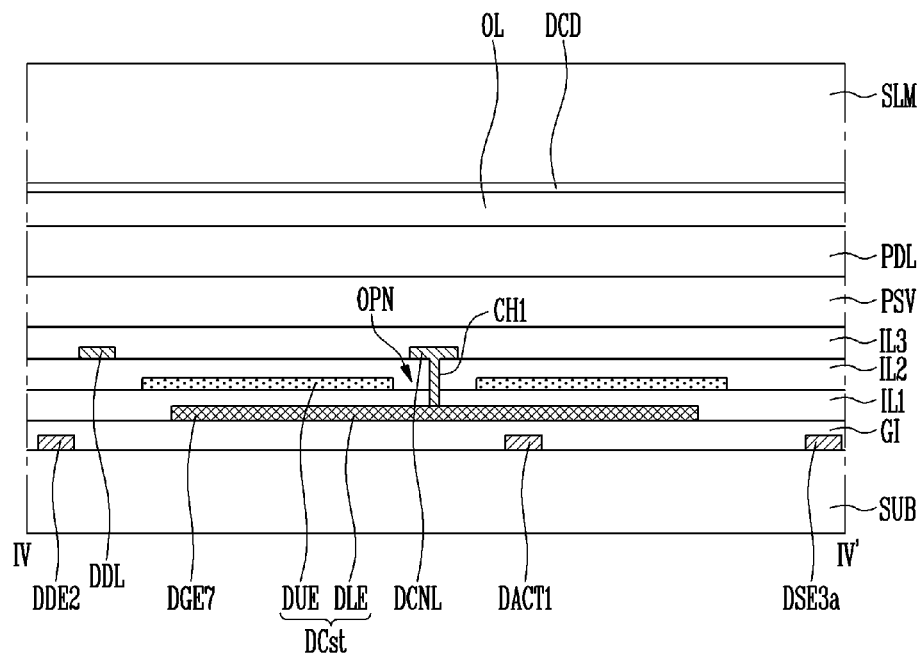
FIG. 11 is a sectional view taken along line IV-IV' of FIG. 9.
Figure 12:
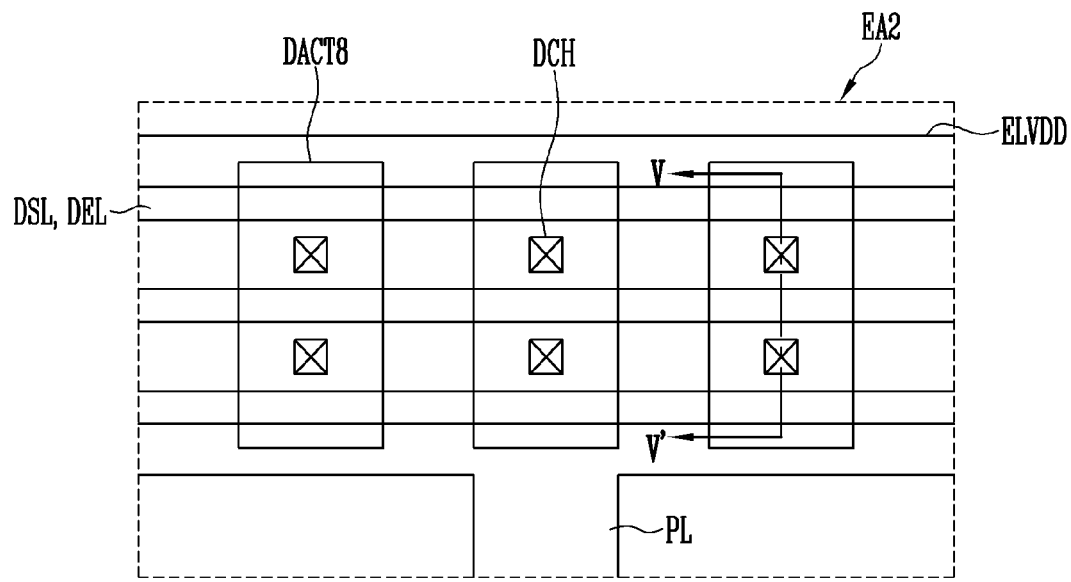
FIG. 12 is an enlarged view of region EA2 of FIG. 7.
Figure 13:
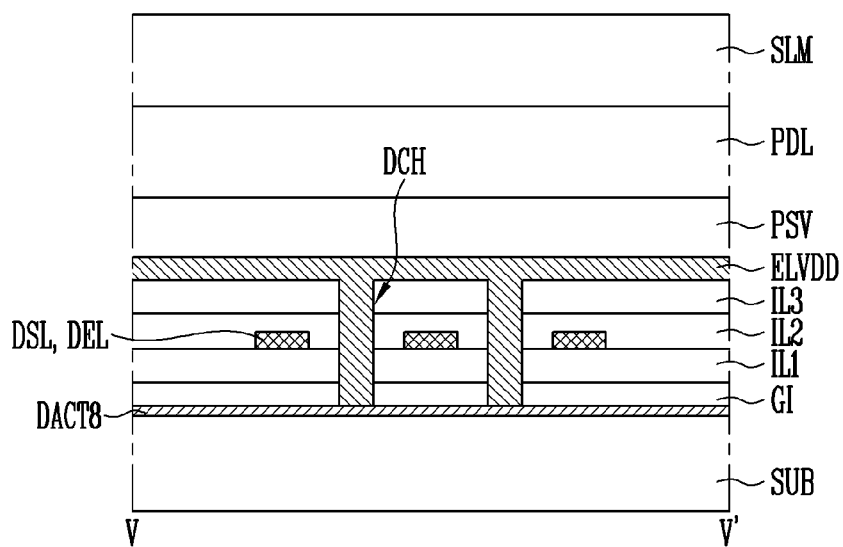
FIG. 13 is a sectional view taken along line V-V' of FIG. 12.

FIG. 7 is a plan view illustrating a display device according to an embodiment of the present disclosure, which illustrates the display device having dummy parts DMP1 and DMP2 provided in a peripheral region. FIG. 8 is an enlarged view of region EA1 of FIG. 7. FIG. 9 is a plan view illustrating a dummy pixel DPXL of FIG. 8. FIG. 10 is a sectional view taken along line III-III' of FIG. 9. FIG. 11 is a sectional view taken along line IV-IV' of FIG. 9. FIG. 12 is an enlarged view of region EA2 of FIG. 7. FIG. 13 is a sectional view taken along line V-V' of FIG. 12. Based on one dummy pixel that is disposed in a second peripheral region PPA2 and disposed on a pth (p≠i, and p is a natural number) row, dummy scan lines DSL, a dummy light emitting control line DEL, and a dummy data line DDL, which are connected to the dummy pixel, are illustrated in FIGS. 9 to 11.

Referring to FIGS. 7 to 13, in order to compensate for differences in load value between pixel regions, a dummy part DMP1 or DMP2 may be formed in a peripheral region of the second area A2 and the third area A3, so that structures having different parasitic capacitances can be employed. That is, in order to compensate for differences in load value between scan lines or light emitting control lines in a first pixel region PXA1 and a second pixel region PXA2, the dummy part DMP1 or DMP2 is not provided in a first peripheral region PPA1 corresponding to the first pixel region PXA1, and a first dummy part DMP1 may be provided in a second peripheral region PPA2 corresponding to the second pixel region PXA2.

In an embodiment of the present disclosure, the first dummy part DMP1 may overlap with dummy scan lines DSL connected to second scan lines S2$p$ and a dummy light emitting control line DEL connected to second light emitting control lines E2$p$. The dummy scan lines DSL and the dummy light emitting control line DEL may be disposed in a peripheral region, e.g., the second peripheral region PPA2. The dummy scan lines DSL may include a pth dummy scan line DSLp and a (p−1)th dummy scan line DSLp−1, which are connected to a pth second scan line S2$p$ and a (p−1)th second scan line S2$p$−1.

The first dummy part DMP1 may include at least one sub-dummy part DMP11 and DMP12. For example, the first dummy part DMP1 may include a first sub-dummy part DMP11. The first sub-dummy part DMP11 may compensate for load values of the second scan lines S2$p$−1 and S2$p$ or the second light emitting control lines E2$p$.

The first sub-dummy part DMP11 may be disposed at a longitudinal part of the second peripheral region PPA2, which is adjacent to a longitudinal side of the second pixel region PXA2.

The first sub-dummy part DMP11 may include a plurality of dummy pixels DPXL. The dummy pixels DPXL may have a structure similar to that of a second pixel PXL2 provided in the second pixel region PXA2. However, the dummy pixels DPXL may have a structure in which a power line PL, a second bridge BRP2, a light generation layer LGL and a first electrode AD of the second pixel PXL are omitted.

A detailed structure of the dummy pixels DPXL will be described below.

The dummy pixels DPXL may be connected to the dummy scan lines DSL and the dummy light emitting control line DEL. Each of the dummy pixels DPXL may include a dummy data line DDL intersecting the dummy scan lines DSL and the dummy light emitting line DEL, at least one dummy transistor DT1, DT2, DT3, DT4, DT5, DT6, and DT7 electrically connected to the dummy scan lines DSL and the dummy data line DDL, and a dummy storage capacitor DCst.

In this embodiment, each of the dummy pixels DPXL may include first to seventh dummy transistors DT1, DT2, DT3, DT4, DT5, DT6, and DT7. Each of the first to seventh dummy transistors DT1, DT2, DT3, DT4, DT5, DT6, and DT7 may include a dummy gate electrode, a dummy active pattern, a dummy source electrode, and a dummy drain electrode.

This will be described in more detail. The first dummy transistor DT1 may include a first dummy gate electrode DGE1, a first dummy active pattern DACT1, a first dummy source electrode DSE1, a first dummy drain electrode DDE1, and a dummy connection line DCNL.

The first dummy gate electrode DGE1 may be connected to a third dummy drain electrode DDE3 of the third dummy transistor DT3 and a fourth dummy drain electrode DDE4 of the fourth dummy transistor DT4. The dummy connection line DCNL may connect between the first dummy gate electrode DGE1 and the third and fourth dummy drain electrodes DDE3 and DDE4. One end of the dummy connection line DCNL may be connected to the first dummy gate electrode DGE1 through a first contact hole CH1, and the other end of the dummy connection line DCNL may be connected to the third dummy drain electrode DDE3 and the fourth dummy drain electrode DDE4 through a second contact hole CH2.

In an embodiment of the present disclosure, the first dummy active pattern DACT1, the first dummy source electrode DSE1, and the first dummy drain electrode DDE1 may be formed of a semiconductor layer undoped or doped with impurities. For example, the first dummy source electrode DSE1 and the first dummy drain electrode DDE1 may be formed of a semiconductor layer doped with impurities, and the first dummy active pattern DACT1 may be formed of a semiconductor layer undoped with impurities.

The first dummy source electrode DSE1 may be connected to one end of the first dummy active pattern DACT1. The first dummy source electrode DSE1 may be connected to a second dummy drain electrode DDE2 of the second dummy transistor DT2 and a fifth dummy drain electrode DDE5 of the fifth dummy transistor DT5. The first dummy drain electrode DDE1 may be connected to the other end of the first dummy active pattern DACT1. The first dummy drain electrode DDE1 may be connected to a third dummy source electrode DSE3 of the third dummy transistor DT3 and a sixth dummy source electrode DSE6 of the sixth dummy transistor DT6.

The second dummy transistor DT2 may include a second dummy gate electrode DGE2, a second dummy active pattern DACT2, a second dummy source electrode DSE2, and the second dummy drain electrode DDE2.

The second dummy gate electrode DGE2 may be connected to the pth dummy scan line DSLp. The second dummy gate electrode DGE2 may be provided as a portion of the pth dummy scan line DSLp or may be provided in a shape protruding from the pth dummy scan line DSLp. In an embodiment of the present disclosure, the second dummy active pattern DACT2, the second dummy source electrode DSE2, and the second dummy drain electrode DDE2 may be formed of a semiconductor layer undoped or doped with impurities. For example, the second dummy source electrode DSE2 and the second dummy drain electrode DDE2 may be formed of a semiconductor layer doped with impurities, and the second dummy active pattern DACT2 may be formed of a semiconductor layer undoped with impurities. The second dummy active pattern DACT2 corresponds to a portion overlapping with the second dummy gate electrode DGE2. One end of the second dummy source electrode DSE2 may be connected to the second dummy active pattern DACT2. The other end of the second dummy source electrode DSE2 may be connected to the dummy data line DDL through a sixth contact hole CH6. One end of the second dummy drain electrode DDE2 may be connected to the second dummy active pattern DACT2. The other end of the second dummy drain electrode DDE2 may be connected to the first dummy source electrode DSE1 of the first dummy transistor DT1 and the fifth dummy drain electrode DDE5 of the fifth dummy transistor DT5.

The third dummy transistor DT3 may be provided in a double gate structure. That is, the third dummy transistor DT3 may include a 3$a$th dummy transistor DT3$a$ and a 3$b$th dummy transistor DT3$b$. The 3$a$th dummy transistor DT3$a$ may include a 3$a$th dummy gate electrode DGE3$a$, a 3$a$th dummy active pattern DACT3$a$, a 3$a$th dummy source electrode DSE3$a$, and a 3$a$th dummy drain electrode DDE3$a$. The 3$b$th dummy transistor DT3$b$ may include a 3$b$th dummy gate electrode DGE3$b$, a 3$b$th dummy active pattern DACT3$b$, a 3$b$th dummy source electrode DSE3$b$, and a 3$b$th dummy drain electrode DDE3$b$. Hereinafter, the 3$a$th dummy gate electrode DGE3$a$ and the 3$b$th dummy gate electrode DGE3$b$ are referred to as a third dummy gate electrode DGE3, the 3$a$th dummy active pattern DACT3$a$ and the 3$b$th dummy active pattern DACT3$b$ are referred to as a third dummy active pattern DACT3, the 3$a$th dummy source electrode DSE3$a$ and the 3$b$th dummy source electrode DSE3$b$ are referred to as the third dummy source electrode DSE3, and the 3$a$th dummy drain electrode DDE3*a* and the 3*b*th dummy drain electrode DDE3*b* are referred to as the third dummy drain electrode DDE3.

The third dummy gate electrode DGE3 may be connected to the *p*th dummy scan line DSL*p*. The third dummy gate electrode DGE3 may be provided as a portion of the *p*th dummy scan line DSL*p* or may be provided in a shape protruding from the *p*th dummy scan line DSL*p*. For example, the 3*b*th dummy gate electrode DGE3*b* may be provided in a shape protruding the *p*th dummy scan line DSL*p*, and the 3*a*th dummy gate electrode DGE3*a* may be provided as a portion of the *p*th dummy scan line DSL*p*.

The third dummy active pattern DACT3, the third dummy source electrode DSE3, and the third dummy drain electrode DDE3 may be formed of a semiconductor layer undoped or doped with impurities. For example, the third dummy source electrode DSE3 and the third dummy drain electrode DDE3 may be formed of a semiconductor layer doped with impurities, and the third dummy active pattern DACT3 may be formed of a semiconductor layer undoped with impurities. The third dummy active pattern DACT3 corresponds to a portion overlapping with the third dummy gate electrode DDE3. One end of the third dummy source electrode DSE3 may be connected to the third dummy active pattern DACT3. The other end of the third dummy source electrode DSE3 may be connected to the first dummy drain electrode DDE1 of the first dummy transistor DT1 and the sixth dummy source electrode DSE6 of the sixth dummy transistor DT6. One end of the third dummy drain electrode DDE3 may be connected to the third dummy active pattern DACT3. The other end of the third dummy drain electrode DDE3 may be connected to the fourth dummy drain electrode DDE4 of the fourth dummy transistor DT4. In addition, the third dummy drain electrode DDE3 may be connected to the first dummy gate electrode DGE1 of the first dummy transistor DT1 through the dummy connection line DCNL, the second contact hole CH2, and the first contact hole CH1.

The fourth dummy transistor DT4 may be provided in a double gate structure. That is, the fourth dummy transistor DT4 may include a 4*a*th dummy transistor DT4*a* and a 4*b*th dummy transistor DT4*b*. The 4*a*th dummy transistor DT4*a* may include a 4*a*th dummy gate electrode DGE4*a*, a 4*a*th dummy active pattern DACT4*a*, a 4*a*th dummy source electrode DSE4*a*, and a 4*a*th dummy drain electrode DDE4*a*. The 4*b*th dummy transistor DT4*b* may include a 4*b*th dummy gate electrode DGE4*b*, a 4*b*th dummy active pattern DACT4*b*, a 4*b*th dummy source electrode DSE4*b*, and a 4*b*th dummy drain electrode DDE4*b*. Hereinafter, the 4*a*th dummy gate electrode DGE4*a* and the 4*b*th dummy gate electrode DGE4*b* are referred to as a fourth dummy gate electrode DGE4, the 4*a*th dummy active pattern DACT4*a* and the 4*b*th dummy active pattern DACT4*b* are referred to as a fourth dummy active pattern DACT4, the 4*a*th dummy source electrode DSE4*a* and the 4*b*th dummy source electrode DSE4*b* are referred to as a fourth dummy source electrode DSE4, and the 4*a*th dummy drain electrode DDE4*a* and the 4*b*th dummy drain electrode DDE4*b* are referred to as a fourth dummy drain electrode DDE4.

The fourth dummy gate electrode DGE4 may be connected to the (*p*−1)th dummy scan line DSL*p*−1. The fourth dummy gate electrode DGE4 may be provided as a portion of the (*p*−1)th dummy scan line DSL*p*−1 or may be provided in a shape protruding from the (*p*−1)th dummy scan line DSL*p*−1. For example, the 4*a*th dummy gate electrode DGE4*a* may be provided as a portion of the (*p*−1)th dummy scan line DSL*p*−1, and the 4*b*th dummy gate electrode DGE4*b* may be provided in a shape protruding from the (*p*−1)th dummy scan line DSL*p*−1.

The fourth dummy active pattern DACT4, the fourth dummy source electrode DSE4, and the fourth dummy drain electrode DDE4 may be formed of a semiconductor layer undoped or doped with impurities. For example, the fourth dummy source electrode DSE4 and the fourth dummy drain electrode DDE4 may be formed of a semiconductor layer doped with impurities, and the fourth dummy active pattern DACT4 may be formed of a semiconductor layer undoped with impurities. The fourth dummy active pattern DACT4 corresponds to a portion overlapping with the fourth dummy gate electrode DGE4.

One end of the fourth dummy source electrode DSE4 may be connected to the fourth dummy active pattern DACT4. The other end of the fourth dummy source electrode DSE4 may be connected to an initialization power line IPL provided on a (*p*−1)th row and a seventh dummy drain electrode DDE7 of a seventh dummy transistor DT7 of a first dummy pixel DPXL1 on the (*p*−1)th row. A dummy auxiliary connection line DAUX may be provided between the fourth dummy source electrode DSE4 and the initialization power line IPL. One end of the dummy auxiliary connection line DAUX may be connected to the fourth dummy source electrode DSE4 through a ninth contact hole CH9. The other end of the dummy auxiliary connection line DAUX may be connected to the initialization power line IPL on the (*p*−1)th row through an eighth contact hole CH8 of the dummy pixel DPXL on the (*p*−1)th row. One end of the fourth dummy drain electrode DDE4 may be connected to the fourth dummy active pattern DACT4. The other end of the fourth dummy drain electrode DDE4 may be connected to the third dummy drain electrode DDE3 of the third dummy transistor DT3. The fourth dummy drain electrode DDE4 may be connected to the first dummy gate electrode DGE1 of the first dummy transistor DT1 through the dummy connection line DCNL, the second contact hole CH2, and the first contact hole CH1.

The fifth dummy transistor DT5 may include a fifth dummy gate electrode DGE5, a fifth dummy active pattern DACT5, a fifth dummy source electrode DSE5, and the fifth dummy drain electrode DDE5.

The fifth dummy gate electrode DGE5 may be connected to a dummy light emitting control line DE1. The fifth dummy gate electrode DGE5 may be provided as a portion of the dummy light emitting control line DE1 or may be provided in a shape protruding from the dummy light emitting control line DE1. The fifth dummy active pattern DACT5, the fifth dummy source electrode DSE5, and the fifth dummy drain electrode DDE5 may be formed of a semiconductor layer undoped or doped with impurities. For example, the fifth dummy source electrode DSE5 and the fifth dummy drain electrode DDE5 may be formed of a semiconductor layer doped with impurities, and the fifth dummy active pattern DACT5 may be formed of a semiconductor layer undoped with impurities. The fifth dummy active pattern DACT5 corresponds to a portion overlapping with the fifth dummy gate electrode DGE5. One end of the fifth dummy source electrode DSE5 may be connected to the fifth dummy active pattern DACT5. The other end of the fifth dummy drain electrode DDE5 may be connected to the first dummy source electrode DSE1 of the first dummy transistor DT1 and the second dummy drain electrode DDE2 of the second dummy transistor DT2.

The sixth dummy transistor DT6 may include a sixth dummy gate electrode DGE6, a sixth dummy active pattern DACT6, the sixth dummy source electrode DSE6, and a sixth dummy drain electrode DDE6.

The sixth dummy gate electrode DGE6 may be connected to the dummy light emitting control line DE1. The sixth dummy gate electrode DGE6 may be provided as a portion of the dummy light emitting control line DE1 or may be provided in a shape protruding from the dummy light emitting control line DE1. The sixth dummy active pattern DACT6, the sixth dummy source electrode DSE6, and the sixth dummy drain electrode DDE6 may be formed of a semiconductor layer undoped or doped with impurities. For example, the sixth dummy source electrode DSE6 and the sixth dummy drain electrode DDE6 may be formed of a semiconductor layer doped with impurities, and the sixth dummy active pattern DACT6 may be formed of a semiconductor layer undoped with impurities. The sixth dummy active pattern DACT6 corresponds to a portion overlapping with the sixth dummy gate electrode DGE6. One end of the sixth dummy source electrode DSE6 may be connected to the sixth dummy active pattern DACT6. The other end of the sixth dummy source electrode DSE6 may be connected to the first dummy drain electrode DDE1 of the first dummy transistor DT1 and the third dummy source electrode DSE3 of the third dummy transistor DT3. One end of the sixth dummy drain electrode DDE6 may be connected to the sixth dummy active pattern DACT6. The other end of the sixth dummy drain electrode DDE6 may be connected to a seventh dummy source electrode DSE7 of the seventh dummy transistor DT7.

The seventh dummy transistor DT7 may include a seventh dummy gate electrode DGE7, a seventh dummy active pattern DACT7, the seventh dummy source electrode DSE7, and a seventh dummy drain electrode DDE7.

The seventh dummy gate electrode DGE7 may be connected to the pth dummy scan line DSLp. The seventh dummy gate electrode DGE7 may be provided as a portion of the pth dummy scan line DSLp or may be provided in a shape protruding from the pth dummy scan line DSLp. The seventh dummy active pattern DACT7, the seventh dummy source electrode DSE7, and the seventh dummy drain electrode DDE7 may be formed of a semiconductor layer undoped or doped with impurities. For example, the seventh dummy source electrode DSE7 and the seventh dummy drain electrode DDE7 may be formed of a semiconductor layer doped with impurities, and the seventh dummy active pattern DACT7 may be formed of a semiconductor layer undoped with impurities. The seventh dummy active pattern DACT7 corresponds to a portion overlapping with the seventh dummy gate electrode DGE7. One end of the seventh dummy source electrode DSE7 may be connected to the seventh dummy active pattern DACT7. The other end of the seventh dummy source electrode DSE7 may be connected to the sixth dummy drain electrode DDE6 of the sixth dummy transistor DT6. The other end of the seventh dummy drain electrode DDE7 may be connected to the initialization power line IPL. In addition, the seventh dummy drain electrode DDE7 may be connected to a fourth dummy source electrode DSE4 of a fourth dummy transistor DT4 of a second dummy pixel DPXL2 disposed on a (p+1)th row. The seventh dummy drain electrode DDE7 and the fourth dummy source electrode DSE4 of the fourth dummy transistor DT4 of the second dummy pixel DPXL2 disposed on the (p+1)th row may be connected through the dummy auxiliary line DAUX, the eighth contact hole CH8, and the ninth contact hole CH9.

The dummy storage capacitor DCst may include a dummy lower electrode DLE and a dummy upper electrode DUE. The dummy lower electrode DLE may be configured as the first dummy gate electrode DGE1 of the first dummy transistor DT1.

The dummy upper electrode DUE overlaps with the first dummy gate electrode DGE1, and may cover the dummy lower electrode DLE when viewed in a plan view. As the overlapping area of the dummy upper electrode DUE and the dummy lower electrode DLE is widened, the capacitance of the dummy storage capacitor DCst may be increased. The dummy upper electrode DUE may extend in the first direction DR1. In an embodiment of the present disclosure, a voltage having the same level as the first power source may be applied to the dummy upper electrode DUE. The dummy upper electrode DUE may have an opening OPN in a region including the first contact hole CH1 through which the first dummy gate electrode DGE1 and the dummy connection line DCNL contact each other.

In the dummy pixels DPXL of the first sub-dummy part DMP11, the dummy scan lines DSL and the dummy light emitting control line DEL overlap with the dummy data line DDL and the first to seventh dummy active patterns DACT1, DACT2, DACT3, DACT4, DACT5, DACT6, and DACT7, thereby forming a parasitic capacitor. The parasitic capacitance of the parasitic capacitor may increase loads of the second scan lines S2$p$ and the second light emitting control line E2$p$. Thus, the parasitic capacitance can compensate for load values of the second scan lines S2$p$ and the second light emitting control line E2$p$.

Hereinafter, a structure of the dummy pixel DPXL will be described along a stacking order with reference to FIGS. 9 to 11.

Dummy active patterns DACT1 to DACT7 (hereinafter, referred to as DACT) may be provided on a substrate SUB. The dummy active patterns may include first to seventh dummy active patterns DACT1 to DACT7. The first to seventh dummy active patterns DACT1 to DACT7 may include a semiconductor material.

A buffer layer (not shown) may be provided between the substrate SUB and the first to seventh dummy active patterns DACT1 to DACT7.

A gate insulating layer GI may be provided on the substrate SUB on which the first to seventh dummy active patterns DACT1 to DACT7 are formed.

A (p−1)th dummy scan line DSLp−1, a pth dummy scan line DSLp, a dummy light emitting control line DEL, and first to seventh dummy gate electrodes DGE1 to DGE7 may be provided on the gate insulating layer GI. The first dummy gate electrode DGE1 may be a dummy lower electrode DLE of a dummy storage capacitor DCst. The second dummy gate electrode DGE2 and the third dummy gate electrode DGE3 may be integrally formed with the pth dummy scan line DSLp. The fourth dummy gate electrode DGE4 may be integrally formed with the (p−1)th dummy scan line DSLp−1. The fifth dummy gate electrode DGE5 and the sixth dummy gate electrode DGE6 may be integrally formed with the dummy light emitting control line DEL. The seventh dummy gate electrode DGE7 may be integrally formed with the pth dummy scan line DSLp.

A first interlayer insulating layer IL1 may be provided on the substrate SUB on which the (p−1)th dummy scan line DSLp−1 and the like are formed.

A dummy upper electrode DUE of the dummy storage capacitor DCst and an initialization power line IPL may be provided on the first interlayer insulating layer IL1. The dummy upper electrode DUE may cover the dummy lower electrode DLE. The dummy upper electrode DUE and the dummy lower electrode DLE may constitute the dummy storage capacitor DCst with the first interlayer insulating layer IL1 interposed therebetween. The initialization power line IPL may have a shape in which an initialization power line on a pth row extends to a second peripheral region PPA2.

A second interlayer insulating layer IL2 may be provided on the substrate SUB on which the dummy upper electrode DUE and the initialization power line IPL are disposed.

A dummy data line DDL, a dummy connection line DCNL, a dummy auxiliary connection line DAUX, and a first dummy bridge pattern DBRP1 may be provided on the second interlayer insulating layer IL2.

The dummy data line DDL may be connected to a second dummy source electrode DSE2 through a sixth contact hole CH6 passing through the first interlayer insulating layer IL1, the second interlayer insulating layer IL2, and the gate insulating layer GI.

The dummy connection line DCNL may be connected to the first dummy gate electrode DGE1 through a first contact hole CH1 passing through the first interlayer insulating layer IL1 and the second interlayer insulating layer IL2. Also, the dummy connection line DCNL may be connected to a third dummy drain electrode DDE3 and a fourth dummy drain electrode DDE4 through a second contact hole CH2 passing through the gate insulating layer GI, the first interlayer insulating layer IL1, and the second interlayer insulating layer IL2.

The dummy auxiliary connection line DAUX may be connected to the initialization power line IPL through an eighth contract hole CH8 passing through the second interlayer insulating layer IL2. Also, the dummy auxiliary connection line DAUX may be connected to a fourth dummy source electrode DSE4 and a seventh dummy drain electrode DDE7 of a dummy pixel DPXL on a (p−1)th row through a ninth contact hole CH9 passing through the gate insulating layer GI, the first interlayer insulating layer IL1, and the second interlayer insulating layer IL2.

The first dummy bridge pattern DBRP1 may be connected to a sixth dummy drain electrode DDE6 and a first dummy source electrode DSE1 through a seventh contact hole CH7 passing through the gate insulating layer GI, the first interlayer insulating layer IL1, and the second interlayer insulating layer IL2.

A third interlayer insulating layer IL3 may be provided on the substrate SUB on which the dummy data line DDL and the like are formed. A protective layer PSV may be provided on the third interlayer insulating layer IL3.

A pixel defining layer PDL may be provided on the protective layer PSV.

An organic layer OL may be provided on the pixel defining layer PDL, and a second dummy electrode DCD may be provided on the organic layer. The organic layer OL may be provided as the light emitting layer EML of the organic light emitting device OLED of the first pixel PXL1 shown in FIGS. 1 to 6. Here, the organic layer may include at least one of a hole injection layer, hole transport layer, hole blacking layer, an electron transport layer, and an electron injection layer, except a light generation layer LGL. In addition, the second dummy electrode DCD may include the same material as the second electrode CD. The second dummy electrode DCD may be connected to the second electrode CD of the organic light emitting device OLED. Thus, the second electrode CD can receive power applied from the second power supply line (see "ELVSS" of FIGS. 2 and 3) through the second dummy electrode DCD.

Like the first pixel PXL1, an encapsulation layer SLM may be provided on the second dummy electrode DCD.

As described above, the dummy pixel DPXL may have a structure in which the power line PL, the second bridge BRP2, the first electrode AD, and the light generation layer LGL of the first pixel PXL1 shown in FIGS. 1 to 6 are omitted. Thus, in the dummy pixel DPXL, light cannot be emitted from the organic layer OL. In addition, since the dummy pixel DPXL has a structure in which the power line PL, the second bridge BRP2, and the first electrode AD are omitted, it is possible to prevent a short circuit between the power line PL and the first electrode AD or a short circuit between the second bridge BRP2 and the first electrode AD.

In an embodiment of the present disclosure, the first dummy part DMP1 may further include a second sub-dummy part DMP12. The second sub-dummy part DMP12 may be electrically connected to the first sub-dummy part DMP11. The second sub-dummy part DMP12 may compensate for, together with the first sub-dummy part DMP11, load values of the second scan lines $S2p$ and the second light emitting control lines $E2p$.

The first sub-dummy part DMP11 and the second sub-dummy part DMP12 may be disposed to be spaced apart from each other. For example, since the first sub-dummy part DMP11 is disposed at the longitudinal part of the second peripheral region PPA2 adjacent to a longitudinal side of the second pixel region PXA2, the second sub-dummy part DMP12 may be disposed at the lateral part of the second peripheral region PPA2 adjacent to a lateral side of the second pixel region PXA2. As described above, the first sub-dummy part DMP11 and the second sub-dummy part DMP12 are disposed in the second peripheral region PPA2 to be spaced apart from each other, so that the width of the second peripheral region PPA2 can be decreased.

The second sub-dummy part DMP12 may be provided in a region in which it overlaps with a power supply line. The power supply line may be one of the first power supply line ELVDD and the second power supply line ELVSS, which are shown in FIGS. 1 to 6. Hereinafter, for convenience of description, a case where the dummy scan lines DSL and the dummy light emitting control line DEL are provided to overlap with the first power supply line ELVDD is illustrated as an example.

The first power supply line ELVDD may be formed of the same material using the same process as the second bridge pattern BRP2 shown in FIGS. 4 to 6. Therefore, the first power supply line ELVDD may be formed on the same layer as the power line PL of the first pixel PXL of the first pixel PXL shown in FIGS. 1 to 6, e.g., the third interlayer insulating layer IL3.

In an embodiment of the present disclosure, a case where the first power supply line ELVDD is formed on the same layer as the second bridge pattern BRP2 has been described as an example, but the present disclosure is not limited thereto. For example, the first power supply line ELVDD may be formed on the same layer as the first bridge pattern BRP1 and the connection line CNL of the first pixel region PXA1.

An eighth dummy active pattern DACT8 disposed on the same layer as the dummy active pattern may be further provided in the second sub-dummy part DMP12. Also, the eighth dummy active pattern DACT8 may overlap with the dummy scan lines DSL and the dummy light emitting control line DEL. The eighth dummy active pattern DACT8 may be electrically connected to the first power supply line ELVDD through a dummy contact hole DCH. The dummy contact hole DCH may pass through the gate insulating layer GI, the first interlayer insulating layer IL1, the second interlayer insulating layer IL2, and the third interlayer insulating layer IL3.

In the second sub-dummy part DMP12, at least one of the first power supply line ELVDD and the eighth dummy active pattern DACT8 may overlap with the dummy scan line DSL and the dummy light emitting control line DEL, thereby forming a parasitic capacitor. For example, both of the first power supply line ELVDD and the eighth dummy active pattern DACT8 may overlap with the dummy scan line DSL and the dummy light emitting control line DEL, thereby forming a parasitic capacitor. When the first power supply line ELVDD does not overlap with the eighth dummy active pattern DACT8, the eighth dummy active pattern DACT8 may overlap with the dummy scan line DSL and the dummy light emitting control line DEL, thereby forming a parasitic capacitor. The parasitic capacitance of the parasitic capacitor of the second sub-dummy part DMP12 can increase loads of the second scan lines S2p and the second light emitting control lines E2p. Thus, the parasitic capacitance of the second sub-dummy part DMP12 can compensate for load values of the second scan lines S2p and the second light emitting control lines E2p.

As described above, the parasitic capacitances of the parasitic capacitors of the first sub-dummy part DMP11 and the second sub-dummy part DMP12 can increase loads of the second scan lines S2p and the second light emitting control lines E2p. Thus, the parasitic capacitances can compensate for load values of the second scan lines S2p and the second light emitting control line E2p. As a result, the load values of the second scan lines S2p and the second light emitting control line E2p may be equal or similar to those of the first scan lines S11 to S1n, S1i−1, and S1i and the first light emitting control lines E11 to E1n and E1i of the first pixel region PXA1.

In an embodiment of the present disclosure, in order to compensate for differences in load value of the scan lines and the light emitting control lines between the first pixel region PXA1 and the third pixel region PXA3, the first and second dummy parts DMP1 and DMP2 are not provided in the first peripheral region PPA1 corresponding to the first pixel region PXA1, and a second dummy part DMP2 may be provided in the third peripheral region PPA3 corresponding to the third pixel region PXA3.

In an embodiment of the present disclosure, the second dummy part DMP2 may overlap with the dummy scan lines DSL connected to the third scan lines S31 and S32 and the dummy light emitting control line DEL connected to the third light emitting control lines E31 and E32. The dummy scan lines DSL and the dummy light emitting control line DEL may be disposed in a peripheral region, e.g., the third peripheral region PPA3. Load values compensated by the second dummy part DMP2 may equal to those compensated by the first dummy part DMP1.

The second dummy part DMP2 may include at least one sub-dummy part DMP21 and DMP22. For example, the second dummy part DMP2 may include a third sub-dummy part DMP21. The third sub-dummy part DMP21 may compensate for load values of the third scan lines S31 and S32 or the third light emitting control lines E31 and E32 shown in FIGS. 1 to 6. The third sub-dummy part DMP21 may be disposed at the longitudinal part of the third peripheral region PPA3 adjacent to a longitudinal side of the third pixel region PXA3. The third sub-dummy part DMP21 may have the same structure as the first sub-dummy part DMP11 of the first dummy part DMP1.

Like the first sub-dummy part DMP11, the third sub-dummy part DMP21 may include a plurality of dummy pixels DPXL. The dummy pixels DPXL may overlap with the dummy scan lines DSL and the dummy light emitting control line DEL.

In an embodiment of the present disclosure, the second dummy part DMP2 may further include a fourth sub-dummy part DMP22. The fourth sub-dummy part DMP22 may be electrically connected to the third sub-dummy part DMP21. The fourth sub-dummy part DMP22 can compensate for, together with the third sub-dummy part DMP21, load values of the third scan lines S31 and S32 and the third light emitting control lines E31 and E32.

The third sub-dummy part DMP21 and the fourth sub-dummy part DMP22 may be disposed to be spaced apart from each other. For example, since the third sub-dummy part DMP21 is disposed at the longitudinal part of the third peripheral region PPA3 adjacent to the longitudinal side of the third pixel region PXA3, the fourth sub-dummy part DMP22 may be disposed at the lateral part of the third peripheral region PPA3 adjacent to a lateral side of the third pixel region PXA3. As described above, the third sub-dummy part DMP21 and the fourth sub-dummy part DMP22 are spaced apart from each other in the third peripheral region PPA3, and therefore, the width of the third peripheral region PPA3 may be decreased.

The fourth sub-dummy part DMP22 may be provided in a region in which it overlaps with a power supply line. The power supply line may be one of the first power supply line ELVDD and the second power supply line ELVSS, which are shown in FIGS. 1 to 6, e.g., the first power source line ELVDD.

An eighth dummy active pattern DACT8 disposed on the same layer as the dummy active pattern may be further provided in the fourth sub-dummy part DMP22. Also, the eighth dummy active pattern DACT8 may overlap with the dummy scan lines DSL and the dummy light emitting control line DEL. The eighth dummy active pattern DACT8 may be electrically connected to the first power supply line ELVDD through a dummy contact hole DCH. The dummy contact hole DCH may pass through the gate insulating layer GI, the first interlayer insulating layer IL1, the second interlayer insulating layer IL2, and the third interlayer insulating layer IL3.

In the fourth sub-dummy part DMP22, at least one of the first power supply line ELVDD and the eighth dummy active pattern DACT8 may overlap with the dummy scan line DSL and the dummy light emitting control line DEL, thereby forming a parasitic capacitor. For example, both of the first power supply line ELVDD and the eighth dummy active pattern DACT8 may overlap with the dummy scan line DSL and the dummy light emitting control line DEL, thereby forming a parasitic capacitor. When the first power supply line ELVDD does not overlap with the eighth dummy active pattern DACT8, the eighth dummy active pattern DACT8 may overlap with the dummy scan line DSL and the dummy light emitting control line DEL, thereby forming a parasitic capacitor. The parasitic capacitance of the parasitic capacitor of the fourth sub-dummy part DMP22 can increase loads of the third scan lines S31 and S32 and the third light emitting control lines E31 and E32. Thus, the parasitic capacitance of the fourth sub-dummy part DMP22 can compensate for load values of the third scan lines S31 and S32 and the third light emitting control lines E31 and E32.

As described above, the parasitic capacitances of the parasitic capacitors of the third sub-dummy part DMP21 and the fourth sub-dummy part DMP22 can increase loads of the third scan lines S31 and S32 and the third light emitting control lines E31 and E32. Thus, the parasitic capacitances can compensate for load values of the third scan lines S31 and S32 and the third light emitting control line E31 and E32. As a result, the load values of the third scan lines S31 and S32 and the third light emitting control lines E31 and E32 may be equal or similar to those of the first scan lines S11 to S1n, S1i−1, and S1i and the first light emitting control lines E11 to E1n and E1i of the first pixel region PXA1.

As described above, the display device according to the embodiment of the present disclosure includes dummy parts DMP1 and DMP2, so that differences in load values between scan lines or light emitting control lines can be compensated for each region. Thus, the display device can display an entirely uniform image. In addition, each of the dummy parts DMP1 and DMP2 are divided into a plurality of sub-dummy parts, so that widths of peripheral regions of the display device can be decreased.

Figure 14:
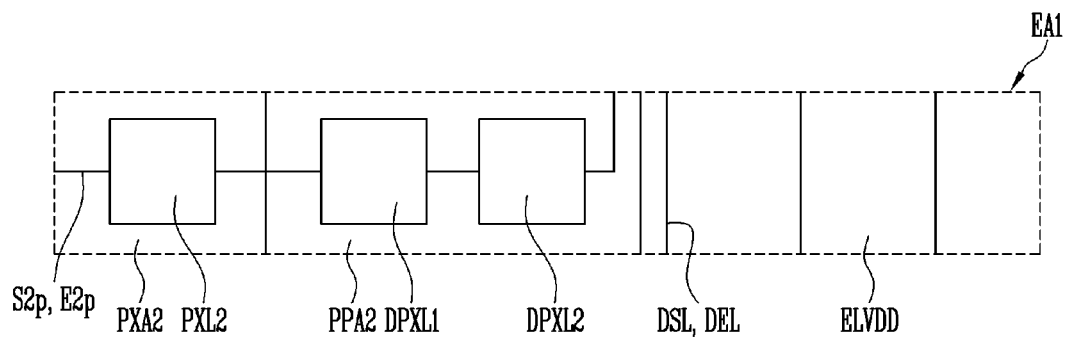
FIG. 14 is a conceptual view illustrating a first sub-dummy part of a display device according to an embodiment of the present disclosure.
Figure 15:
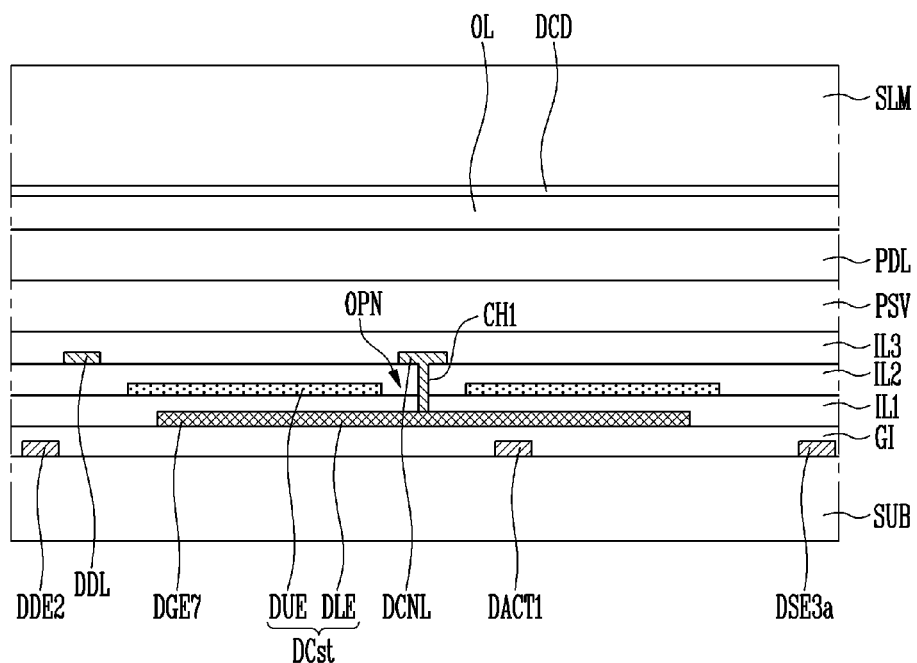
FIG. 15 is a partial sectional view of a first sub-dummy pixel of the first sub-dummy part.
Figure 16:
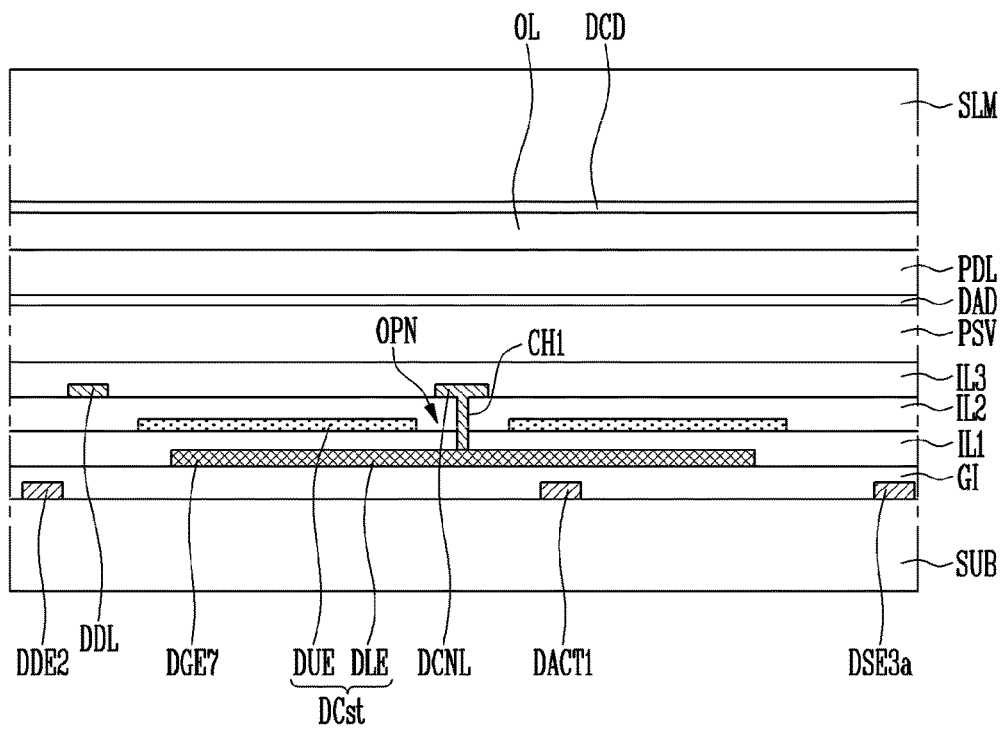
FIG. 16 is a partial sectional view of a second sub-dummy pixel of the first sub-dummy part.

FIG. 14 is a conceptual view illustrating a first sub-dummy part of a display device according to an embodiment of the present disclosure. FIG. 15 is a partial sectional view of a first sub-dummy pixel of the first sub-dummy part. FIG. 16 is a partial sectional view of a second sub-dummy pixel of the first sub-dummy part. In FIG. 14, the region EA1 of FIG. 7 is enlarged and illustrated for convenience of description.

Referring to FIGS. 7 to 9 and 14 to 16, in order to compensate for differences in load value between pixel regions, a dummy part DMP1 or DMP2 may be formed in a peripheral region of the second area A2 and the third area A3, so that structures having different parasitic capacitances can be employed. That is, in order to compensate for differences in load value between scan lines or light emitting control lines in a first pixel region PXA1 and a second pixel region PXA2, the dummy part DMP1 or DMP2 is not provided in a first peripheral region PPA1 corresponding to the first pixel region PXA1, and a first dummy part DMP1 may be provided in a second peripheral region PPA2 corresponding to the second pixel region PXA2.

In an embodiment of the present disclosure, the first dummy part DMP1 may overlap with dummy scan lines DSL connected to second scan lines S2p and a dummy light emitting control line DEL connected to second light emitting control lines E2p. The dummy scan lines DSL and the dummy light emitting control line DEL may be disposed in a peripheral region, e.g., the second peripheral region PPA2. The dummy scan lines DSL may include a pth dummy scan line DSLp and a (p−1)th dummy scan line DSLp−1, which are connected to a pth second scan line S2p and a (p−1)th second scan line S2p−1.

The first dummy part DMP1 may include at least one sub-dummy part DMP11 and DMP12. For example, the first dummy part DMP1 may include a first sub-dummy part DMP11. The first sub-dummy part DMP11 may compensate for load values of the second scan lines S2p−1 and S2p or the second light emitting control lines E2p.

The first sub-dummy part DMP11 may include a plurality of dummy pixels DPXL1 and DPXL2. For example, the first sub-dummy part DMP11 may include a first dummy pixel DPXL1 and a second dummy pixel DPXL2. Here, one of the first dummy pixel DPXL1 and the second dummy pixel DPXL2, e.g., the first dummy pixel DPXL1 may be disposed closer to the second pixel region PXA2 than the second dummy pixel DPXL2.

The first dummy pixel DPXL1 and the second dummy pixel DPXL2 may have a structure similar to that of the second pixel PXL2 provided in the second pixel region PXA2. However, the first dummy pixel DPXL1 may have a structure in which the power line PL, the second bridge BRP2, a light generation layer LGL, and the first electrode AD of the second pixel PXL2 are omitted. The second dummy pixel DPXL2 may have a structure in which the power line PL, a light generation layer LGL, and the second bridge BRP2 of the second pixel PXL2 are omitted.

The first dummy pixel DPXL1 and the second dummy pixel DPXL2 may be connected to the dummy scan lines DSL and the dummy light emitting control line DEL. Each of the first dummy pixel DPXL1 and the second dummy pixel DPXL2 may include a dummy data line DDL intersecting the dummy scan lines DSL and the dummy light emitting line DEL, at least one dummy transistor DT1, DT2, DT3, DT4, DT5, DT6, and DT7 electrically connected to the dummy scan lines DSL and the dummy data line DDL, and a dummy storage capacitor DCst.

Hereinafter, structures of the first dummy pixel DPXL1 and the second dummy pixel DPXL2 will be described along a stacking order.

Dummy active patterns DACT1 to DACT7 (hereinafter, referred to as DACT) may be provided on a substrate SUB. The dummy active may include first to seventh dummy active patterns DACT1 to DACT7.

A gate insulating layer GI may be provided on the substrate SUB on which the first to seventh dummy active patterns DACT1 to DACT7 are formed.

A (p−1)th dummy scan line DSLp−1, a pth dummy scan line DSLp, a dummy light emitting control line DEL, and first to seventh dummy gate electrodes DGE1 to DGE7 may be provided on the gate insulating layer GI. The first dummy gate electrode DGE1 may be a dummy lower electrode DLE of a dummy storage capacitor DCst.

A first interlayer insulating layer IL1 may be provided on the substrate SUB on which the (p−1)th dummy scan line DSLp−1 and the like are formed.

A dummy upper electrode DUE of the dummy storage capacitor DCst and an initialization power line IPL may be provided on the first interlayer insulating layer IL1. The dummy upper electrode DUE may cover the dummy lower electrode DLE. The dummy upper electrode DUE and the dummy lower electrode DLE may constitute the dummy storage capacitor DCst with the first interlayer insulating layer IL1 interposed therebetween.

A second interlayer insulating layer IL2 may be provided on the substrate SUB on which the dummy upper electrode DUE and the initialization power line IPL are disposed.

A dummy data line DDL, a dummy connection line DCNL, a dummy auxiliary connection line DAUX, and a first dummy bridge pattern DBRP1 may be provided on the second interlayer insulating layer IL2.

A third interlayer insulating layer IL3 may be provided on the substrate SUB on which the dummy data line DDL and the like are formed. A protective layer PSV may be provided on the third interlayer insulating layer IL3.

In the first dummy pixel DPXL1, a pixel defining layer PDL may be provided on the protective layer PSV.

In the second dummy pixel DPXL2, a first dummy electrode DAD may be provided on the protective layer PSV. The first dummy electrode DAD may include the same material as the first electrode AD of the second pixel PXL2. The first dummy electrode DAD may be electrically isolated from the first electrode AD. Also, in the second dummy pixel DPXL2, a pixel defining layer PDL may be provided on the first dummy electrode DAD. In the second dummy pixel DPXL2, the pixel defining layer PDL may cover the first dummy electrode DAD. That is, in the second dummy pixel DPXL2, the pixel defining layer PDL may not expose the first dummy electrode DAD.

An organic layer OL may be provided on the pixel defining layer PDL. The organic layer OL may be provided as the light emitting layer EML of the organic light emitting device OLED of the first pixel PXL1 shown in FIGS. 1 to 6. Here, the organic layer may include at least one of a hole injection layer, hole transport layer, hole blacking layer, an electron transport layer, and an electron injection layer, except a light generation layer LGL. In the second dummy pixel DPXL2, the organic layer OL may be electrically isolated from the first dummy electrode DAD by the pixel defining layer PDL.

A second dummy electrode DCD may be provided on the organic layer OL. The second dummy electrode DCD may include the same material as the second electrode CD. The second dummy electrode DCD may be connected to the second electrode CD of the organic light emitting device OLED. Thus, the second electrode CD can receive power applied from the second power supply line (see "ELVSS" of FIGS. 2 and 3) through the second dummy electrode DCD.

In addition, the second dummy electrode DCD may be electrically connected to the first dummy electrode DAD at a portion of the second peripheral region PPA2. Thus, the first dummy electrode DAD and the second dummy electrode DCD may be applied with the same power. For example, the first dummy electrode DAD and the second dummy electrode DCD may be applied with the second power source ELVSS.

As described above, the first dummy electrode DAD is not provided in the first dummy pixel DPXL1, and the first dummy electrode DAD may be provided in the second dummy pixel DPXL2. Therefore, the first dummy electrode DAD and the second dummy electrode DCD do not overlap with each other in the first dummy pixel DPXL1, and the first dummy electrode DAD and the second dummy electrode DCD may overlap with each other in the second dummy pixel DPXL2.

Like the first pixel PXL1, an encapsulation layer SLM may be provided on the second dummy electrode DCD.

As described above, the first dummy pixel DPXL1 and the second dummy pixel DPXL2 may have a structure in which the power line PL, the second bridge BRP2, and the light generation layer LGL of the first pixel PXL1 shown in FIGS. 1 to 6 are omitted. In addition, although the second dummy pixel DPXL2 has the first dummy electrode DAD, the first dummy electrode DAD may be electrically isolated from the organic layer OL. Thus, in the first dummy pixel DPXL1 and the second dummy pixel DPXL2, light cannot be emitted from the organic layer OL.

In addition, since the power line PL, the second bridge BRP2, the light generation layer LGL, and the first electrode AD are omitted in the first dummy pixel DPXL1, it is possible to prevent a short circuit between the power line PL and the first electrode AD or a short circuit between the second bridge BRP2 and the first electrode AD.

As described above, according to the present disclosure, the display device has two or more regions having different areas, and luminance in each region can be uniform.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present disclosure as set forth in the following claims.

What is claimed is:

1. A display device comprising:
   a substrate including a first pixel region in which a first number of pixels are connected to each of first lines in the first pixel region, at least one second pixel region in which a second number of pixels are connected to each of second lines in the at least one second pixel region, the at least one second pixel region being disposed adjacent to the first pixel region, and a peripheral region surrounding the first pixel region and the second pixel region, wherein the first number is greater than the second number;
   first and second pixels respectively provided in the first and second pixel regions;
   a dummy line connected to the second lines and not connected to the first lines, the dummy line extending to the peripheral region; and
   a first dummy part including a dummy pixel connected to the dummy line in the peripheral region.

2. The display device of claim 1, wherein a length of the first line is greater than that of the second line, and the dummy line is connected to the second line.

3. The display device of claim 2, further comprising data lines providing a data signal to the first and second pixels,
   wherein the first line is one of a first scan line providing a scan signal to the first pixel and a first light emitting control line providing a light emitting control signal to the first pixel, and
   wherein the second line is one of a second scan line providing a scan signal to the second pixel and a second light emitting control line providing a light emitting control signal to the second pixel.

4. The display device of claim 3, wherein the first line is a first scan line providing a scan signal to the first pixel, and
   wherein the second line is a second scan line providing a scan signal to the second pixel.

5. The display device of claim 3, wherein the first line is a first light emitting line providing a light emitting control signal to the first pixel, and
   wherein the second line is a second light emitting line providing a light emitting control signal to the second pixel.

6. The display device of claim 3, wherein each of the first and second pixels includes a transistor connected to a corresponding one of the data lines and a corresponding one of the first and second scan lines, a protective layer covering the transistor, and an organic light emitting device connected to the transistor on the protective layer,
   wherein the transistor includes:
   an active pattern provided on the substrate;
   a source electrode and a drain electrode, each connected to the active pattern;
   a gate electrode provided on the active pattern with a gate insulating layer interposed therebetween; and
   an interlayer insulating layer including a first interlayer insulating layer, a second interlayer insulating layer, and a third interlayer insulating layer, which cover the gate electrode and are sequentially stacked, and
   wherein the organic light emitting device includes:
   a first electrode connected to the transistor;
   a pixel defining layer exposing the first electrode;
   a light emitting layer provided on the first electrode; and
   a second electrode provided on the light emitting layer.

7. The display device of claim 6, wherein the dummy line is disposed in the same layer as the gate electrode.

8. The display device of claim 6, wherein the dummy pixel includes:
a dummy data line intersecting the dummy line;
a dummy transistor connected to the dummy line and the dummy data line;
the protective layer covering the dummy transistor;
the pixel defining layer provided on the protective layer;
an organic layer provided on the pixel defining layer; and
a second dummy electrode provided on the organic layer, and
wherein the second dummy electrode includes the same material as the second electrode.

9. The display device of claim 8, wherein the dummy transistor includes:
a dummy active pattern provided on the substrate;
a dummy source electrode and a dummy drain electrode, each connected to the dummy active pattern; and
a dummy gate electrode provided on the dummy active pattern with the gate insulating layer interposed therebetween, the dummy gate electrode being connected to the dummy line.

10. The display device of claim 9, wherein the first dummy part includes a parasitic capacitor formed by the dummy active pattern and the dummy line and a parasitic capacitor formed by the dummy data line and the dummy line.

11. The display device of claim 8, wherein the dummy pixel includes a first dummy pixel and a second dummy pixel, which are electrically connected to each other, and the first dummy pixel is closer to the second pixel region than the second dummy pixel.

12. The display device of claim 11, wherein the second dummy pixel further comprises a first dummy electrode including the same material as the first electrode and provided between the protective layer and the pixel defining layer.

13. The display device of claim 12, wherein the first dummy electrode and the second dummy electrode are electrically connected to each other, to be applied with the same power.

14. The display device of claim 8, further comprising a second dummy part overlapping with the dummy line in the peripheral region, the second dummy part being electrically connected to the first dummy part and disposed to be spaced apart from the first dummy part.

15. The display device of claim 14, further comprising a power supply line disposed on the interlayer insulating layer in the peripheral region, the power supply line overlapping with the dummy line,
wherein the second dummy part includes a parasitic capacitor formed by the dummy line and the power supply line.

16. A display device comprising:
a substrate including a first pixel region in which a first number of pixels are connected to each of first lines in the first pixel region, a second pixel region in which a second number of pixels are connected to each of second lines in the second pixel region and a third pixel region in which a third number of pixels are connected to each of third lines in the third pixel region, the second pixel region and the third pixel region being spaced apart from each other and being disposed adjacent to the first pixel region, and a peripheral region surrounding the first to third pixel regions, wherein the first number is greater than the second number and the third number, and the second number is equal to or greater than the third number;
first to third pixels respectively provided in the first to third pixel regions;
first and second dummy lines connected to the second and third lines, respectively, and not connected to the first lines, the first and second dummy lines extending to the peripheral region;
a first dummy part provided in the peripheral region, the first dummy part compensating for a difference in load value between the first line and the second line; and
a second dummy part provided in the peripheral region, the second dummy part compensating for a difference in load value between the first line and the third line,
wherein each of the first and second dummy parts includes a first sub-dummy part including a dummy pixel connected to the first and second dummy lines.

17. The display device of claim 16, wherein a length of the first line is greater than that of the second and third lines.

18. The display device of claim 17, further comprising data lines providing data signals to the first to third pixels,
wherein the first line is one of a first scan line providing a scan signal to the first pixel and a first light emitting control line providing a light emitting control signal to the first pixel,
wherein the second line is one of a second scan line providing a scan signal to the second pixel and a second light emitting control line providing a light emitting control signal to the second pixel, and
wherein the third line is one of a third scan line providing a scan signal to the third pixel and a third light emitting control line providing a light emitting control signal to the third pixel.

19. The display device of claim 18, wherein the first line is one of a first scan line providing a scan signal to the first pixel and a first light emitting control line providing a light emitting control signal to the first pixel, and
wherein the second line is one of a second scan line providing a scan signal to the second pixel and a second light emitting control line providing a light emitting control signal to the second pixel.

20. The display device of claim 18, wherein each of the first to third pixels includes a transistor connected to a corresponding one of the data lines and a corresponding one of the first to third scan lines, a protective layer covering the transistor, and an organic light emitting device connected to the transistor on the protective layer,
wherein the transistor includes:
an active pattern provided on the substrate;
a source electrode and a drain electrode, each connected to the active pattern;
a gate electrode provided on the active pattern with a gate insulating layer interposed therebetween; and
an interlayer insulating layer including a first interlayer insulating layer, a second interlayer insulating layer, and a third interlayer insulating layer, which cover the gate electrode and are sequentially stacked, and
wherein the organic light emitting device includes:
a first electrode connected to the transistor;
a pixel defining layer exposing the first electrode;
a light emitting layer provided on the first electrode; and
a second electrode provided on the light emitting layer.

21. The display device of claim 20, wherein the dummy line is disposed in the same layer as the gate electrode.

22. The display device of claim 20, wherein the dummy pixel includes:
a dummy data line intersecting the dummy line;

a dummy transistor connected to the dummy line and the dummy data line;
the protective layer covering the dummy transistor;
the pixel defining layer provided on the protective layer;
an organic layer provided on the pixel defining layer; and
a second dummy electrode provided on the organic layer, and
wherein the second dummy electrode includes the same material as the second electrode.

23. The display device of claim 22, wherein the dummy transistor includes:
a dummy active pattern provided on the substrate;
a dummy source electrode and a dummy drain electrode, each connected to the dummy active pattern; and
a dummy gate electrode provided on the dummy active pattern with the gate insulating layer interposed therebetween, the dummy gate electrode being connected to the dummy line.

24. The display device of claim 23, wherein the first sub-dummy part includes a parasitic capacitor formed by the dummy active pattern and the dummy line and a parasitic capacitor formed by the dummy data line and the dummy line.

25. The display device of claim 22, wherein the dummy pixel includes a first dummy pixel and a second dummy pixel, which are electrically connected to each other, and the first dummy pixel is closer to the second pixel region than the second dummy pixel.

26. The display device of claim 25, wherein the second dummy pixel further comprises a first dummy electrode including the same material as the first electrode and provided between the protective layer and the pixel defining layer.

27. The display device of claim 26, wherein the first dummy electrode and the second dummy electrode are electrically connected to each other, to be applied with the same power.

28. The display device of claim 22, wherein the first dummy part and the second dummy part further include a second sub-dummy part, and
wherein the second sub-dummy part overlaps with the dummy line in the peripheral region, is electrically connected to the first sub-dummy part, and is disposed to be spaced apart from the first sub-dummy part.

29. The display device of claim 28, further comprising a power supply line disposed on the interlayer insulating layer in the peripheral region, the power supply line overlapping with the first dummy line,
wherein the second dummy part includes a parasitic capacitor formed by the first dummy line and the power supply line.

30. The display device of claim 22, wherein the first dummy line and the second dummy line are disposed in the same layer as the gate electrode.

* * * * *